(12) United States Patent
Shumkov et al.

(10) Patent No.: US 12,744,531 B2
(45) Date of Patent: Sep. 22, 2026

(54) METHODS AND APPARATUS TO DYNAMICALLY CORRECT LEVEL SHIFTER CIRCUITRY

(71) Applicant: Texas Instruments Incorporated, Dallas, TX (US)

(72) Inventors: Ivan Raykov Shumkov, Freising (DE); Florian Neveu, Neufahrn (DE); Florian Schimkat, Freising (DE)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 140 days.

(21) Appl. No.: 18/789,246

(22) Filed: Jul. 30, 2024

(65) Prior Publication Data

US 2025/0055460 A1 Feb. 13, 2025

Related U.S. Application Data

(60) Provisional application No. 63/531,664, filed on Aug. 9, 2023.

(51) Int. Cl.
*H03K 19/0185* (2006.01)
*H03K 3/037* (2006.01)

(52) U.S. Cl.
CPC ..... *H03K 19/018507* (2013.01); *H03K 3/037* (2013.01)

(58) Field of Classification Search
CPC ............... H03K 3/037; H03K 19/0185; H03K 19/018507
USPC ........................................................ 327/333
See application file for complete search history.

(56) References Cited

U.S. PATENT DOCUMENTS

2007/0176668 A1* 8/2007 Kimura .......... H03K 19/018521 327/333

OTHER PUBLICATIONS

Texas Instruments, "LM51772," Oct. 6, 2023, retrieved from https://www.ti.com/product/LM51772, 11 pages.

* cited by examiner

*Primary Examiner* — William Hernandez
(74) *Attorney, Agent, or Firm* — Charles F. Koch

(57) ABSTRACT

An example apparatus includes: level shifter circuitry having a first input terminal, a second input terminal, and an output terminal; latch circuitry having an input terminal and an output terminal, the input terminal of the latch circuitry coupled to the output terminal of the level shifter circuitry; a first transistor having a first terminal and a control terminal, the first terminal of the first transistor coupled to the first input terminal of the level shifter circuitry; a second transistor having a first terminal, a second terminal, and a control terminal, the first terminal of the second transistor coupled to the control terminal of the first transistor, the control terminal of the second transistor coupled to the first input terminal of the level shifter circuitry; and a third transistor having a terminal coupled to the second terminal of the second transistor.

20 Claims, 9 Drawing Sheets

300
302
304
306
308
VDDH
VSSH
VDDL
D_IN
VSSL
OUT
OUTZ
FB
FBZ
ONESHOT DELAY
310
312
314
316
318
320
324
326
328
330
332
334
336
338
340
342
344
346
348
350
352
354
356
358
360
364
366
368
370
372
374
378
380
382
384
386
388
390
392
394
395
396
397
398

700
720
730
710
740
750
V (V)
15.0
14.0
13.0
12.0
4.3
4.1
3.9
3.7
0.0
5.0
10.0
15.0
20.0
25.0
30.0
35.0
40.0
45.0
50.0
55.0
60.0
TIME (µs)

900
910
920
930
940
950
960
V (V)
I (mA)
V (V)
TIME (µs)
17.0 16.0 15.0 14.0 13.0 12.0
8.0 7.0 6.0 5.0 4.0 3.0 2.0 1.0 0.0
17.5 15.0 12.5 10.0 7.5 5.0 2.5 0.0
2.4 2.5 2.6 2.7 2.8 2.9 3.0 3.1 3.2 3.3 3.4 3.5 3.6 3.7 3.8 3.9 4.0 4.1 4.2

METHODS AND APPARATUS TO DYNAMICALLY CORRECT LEVEL SHIFTER CIRCUITRY

CROSS-REFERENCE TO RELATED APPLICATION

This patent application claims the benefit of and priority to U.S. Provisional Patent Application No. 63/531,664 filed Aug. 9, 2023, which is hereby incorporated herein by reference in its entirety.

TECHNICAL FIELD

This description relates generally to level shifters and, more particularly, to methods and apparatus to dynamically correct level shifter circuitry.

BACKGROUND

As electronics continue to advance, systems have become capable of safely operating at increasingly complex operating conditions, such as higher powers and higher speeds. In level shifter circuitry, increasingly complex circuitry implements advanced techniques for converting logic levels of data between different circuits. Such level shifter circuitry allows circuits, which utilize first logic levels, to accurately interface with other circuits, which utilize second logic levels.

SUMMARY

For methods and apparatus to dynamically correct level shifter circuitry, an example apparatus includes level shifter circuitry having a first input terminal, a second input terminal, and an output terminal; latch circuitry having an input terminal and an output terminal, the input terminal of the latch circuitry coupled to the output terminal of the level shifter circuitry; a first transistor having a first terminal and a control terminal, the first terminal of the first transistor coupled to the first input terminal of the level shifter circuitry; a second transistor having a first terminal, a second terminal, and a control terminal, the first terminal of the second transistor coupled to the control terminal of the first transistor, the control terminal of the second transistor coupled to the first input terminal of the level shifter circuitry; and a third transistor having a first terminal and a control terminal, the first terminal of the third transistor coupled to the second terminal of the second transistor, the control terminal of the third transistor coupled to the output terminal of the latch circuitry. Other examples are described.

For methods and apparatus to dynamically correct level shifter circuitry, an example apparatus includes level shifter circuitry having a first terminal, a second terminal, and a third terminal; current source circuitry having a first terminal and a control terminal, the first terminal of the current source circuitry coupled to the first terminal of the level shifter circuitry; a first transistor having a first terminal, a second terminal, and a control terminal, the first terminal of the first transistor coupled to the control terminal of the current source circuitry, the control terminal of the first transistor coupled to the second terminal of the level shifter circuitry; a second transistor having a first terminal and a second terminal, the first terminal of the second transistor coupled to the second terminal of the first transistor; and a third transistor having a first terminal and a control terminal, the first terminal of the third transistor coupled to the second terminal of the second transistor, the control terminal of the third transistor coupled to the third terminal of the level shifter circuitry. Other examples are described.

For methods and apparatus to dynamically correct level shifter circuitry, an example apparatus include correction circuitry configured to: compare a digital input from a first circuit to a digital output of a second circuit; and generate a current based on the comparison; and level shifter circuitry coupled to the correction circuitry, the level shifter circuitry configured to: receive the digital input in the first circuit; and generate the digital output in the second circuit based on a logical state of the digital input; and adjust the logical state of the digital output responsive to the current from the correction circuitry. Other examples are described.

Figure 1:
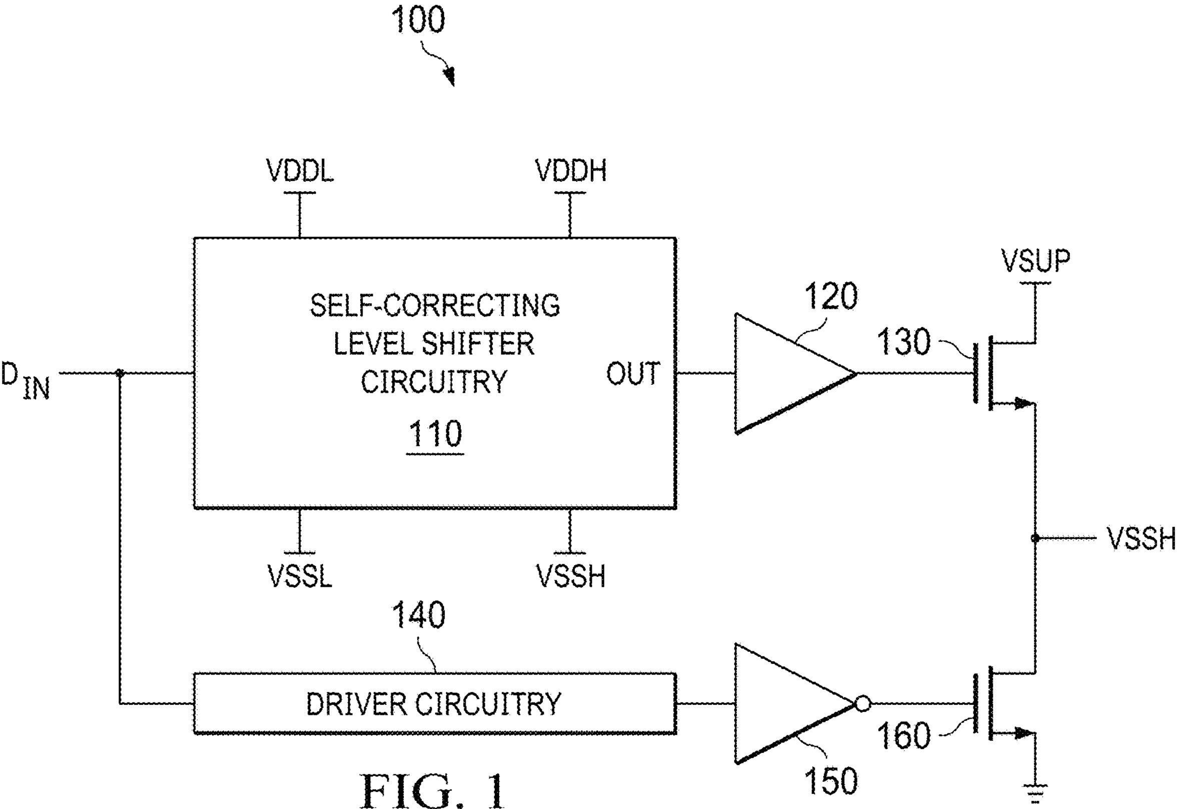
FIG. 1 is a schematic diagram of an example interface system including example self-correcting level shifter circuitry.

The drawings are not necessarily to scale. Generally, the same reference numbers in the drawing(s) and this description refer to the same or similar (functionally and/or structurally) features and/or parts. Although the drawings show regions with clean lines and boundaries, some or all of these lines and boundaries may be idealized. In reality, the boundaries or lines may be unobservable, blended or irregular.

DETAILED DESCRIPTION

As electronics continue to advance, systems have become capable of safely operating at increasingly complex operating conditions, such as higher powers and higher speeds. In level shifter circuitry, increasingly complex circuitry implements advanced techniques for converting logic levels of data between different circuits. Such level shifter circuitry allows circuits, which utilize first logic levels in a first domain, to accurately interface with other circuits, which utilize second logic levels in a second domain.

Low voltage components operate more accurately at higher speeds than higher voltage components. In timing sensitive devices, such as switching power supplies, using relatively low voltage components to perform operations, such as controlling switching, allows the device to support higher switching speeds. Devices utilizing both relatively low voltage and relatively high voltage components need circuitry to support interfacing between components operating at different voltage levels. For example, components operating in an input domain may represent logic levels differently than components operating in an output domain using different voltage than the input domain (also referred to as supply domains). Level shifter circuitry allows components of different logic levels to interface by converting logical data from input logic levels to output logic levels. In some such conversions, the level shifter circuitry converts the input logic levels, which are in relation to an input common potential and an input supply voltage, to the output logic levels, which are in relation to an output common potential and an output supply voltage. Such a conversion of data from one logic level to another logic level is referred to as level shifting.

Level shifter circuitry interfacing between first and second domains receives an input signal, an input supply voltage, and an input common voltage from a first component operating using logic levels defined by the input supply and common voltages. The level shifter circuitry receives an output supply voltage and an output common voltage from a second component operating using logic levels defined by the output supply and common voltages. The level shifter circuitry converts the input signal to an output signal by setting the logical state (e.g., logical one, logical zero) of the output signal equal to the logical state of the input signal. Some level shifter circuitry includes a series of current mirrors, which use drain extended transistors to convert logical states from the logic level of the input signal to the logic level of the output signal. However, as electronics become increasingly complex, designers need level shifter circuitry to accurately level shift digital signals despite increasingly complex operating conditions, such as floating logic levels. When using floating logic levels, one or more of the supply voltages that set the logic levels dynamically changes.

Switching power supplies use level shifter circuitry to convert relatively low voltage digital signals to relatively high voltage signals that control high voltage transistors. In switching power supply devices, the level shifter circuitry needs to accurately control power transistors despite large voltage swings at a switching output terminal. The switching output terminal is the output of the switching power supply being driven by the power transistor. When controlling power field effect transistors (FETs) in a switching power supply, relatively large voltage swings at the switching output terminal may shift logic levels of the level shifter circuitry. Shifting logic levels may prevent the level shifter circuitry from generating an output signal that accurately controls the power FETs. Such adverse states of the output signal resulting from voltage swings may cause damage to downstream circuitry.

One method to prevent unintended logical states of the output signal of the level shifter circuitry is to use floating supply voltages as logic levels of the output signal. In such devices, the level shifter circuitry converts an input signal from a fixed input logic level to an output signal having a floating logic level. Using floating supply voltages for level shifting reduces inaccuracies with the logical state of the output signal. During steady state operations (e.g., durations without rising or falling edges), voltage ringing at the output terminal may result in the logical state of the output signal in accurately representing the input signal. For example, at a first time the output signal may represent a logical zero and at a second time, after a negative voltage swing, the output signal may now represent a logical one. Some level shifter circuitry includes direct current (DC) level shifter circuitry to adjust the DC offset of the output signal to compensate for output supply voltage changes. However, component matching, sizes, and parasitics of the DC level shifter circuitry increases a system-on-chip (SoC) size, a quiescent current, and across process, voltage, and temperature (PVT) variations.

Examples described herein include methods and apparatus to dynamically correct level shifter circuitry using self-correcting level shifter circuitry. In some described examples, the self-correcting level shifter circuitry includes dynamic level shifter circuitry, a first latch, a second latch, and correction circuitry. The dynamic level shifter circuitry receives a digital input signal, an input supply voltage, an input common voltage, an output supply voltage, and an output common voltage. The dynamic level shifter circuitry uses a first current path and a second current path to pull-up one of a first or second output and pull-down the other one of the first or second output based on the logical state of the digital input signal. In some examples, currents of the first current path pull the first output towards the output supply voltage and pull the second output towards the output common voltage. In such examples, currents of the second current path pull the first output towards the output common voltage and pull the second output towards the output supply voltage.

The first latch sets the logical state of the digital output signal by latching the first and second outputs of the level shifter circuitry. The second latch prevents the first and second outputs of the level shifter circuitry from floating between edges of the digital input signal. The correction circuitry compares the logical states of the digital input signal and the digital output signal. When the logical states do not match, the correction circuitry generates a correction voltage across one of a first resistor or second resistor responsive to the mismatch forming one of a first or second current path. The correction circuitry generates one of a first or second correction current through one of the first or second current paths of the dynamic level shifter circuitry based on the logical state of the mismatch at the digital output signal. The correction circuitry supplies the first correction current to the first current path of the dynamic level shifter circuitry responsive to the first resistor generating the correction voltage. The correction circuitry supplies the second correction current to the second current path of the dynamic level shifter circuitry responsive to the second resistor generating the correction voltage. The dynamic level shifter circuitry corrects the first and second outputs responsive to receiving the first or second compensation currents. Advantageously, during steady state operations (e.g., no rising or falling edges), the correction circuitry corrects mismatches between the digital input signal and the digital output signal.

FIG. 1 is a schematic diagram of an example interface system 100. In the example of FIG. 1, the interface system 100 includes self-correcting level shifter circuitry 110, amplifier circuitry 120, a first transistor 130, driver circuitry 140, an inverter 150, and a second transistor 160. The interface system 100 has a data input terminal, an output terminal, an input supply terminal, an input common terminal, an output supply terminal, an output common terminal, an interface supply terminal, and an interface common terminal.

The interface supply terminal of the interface system 100 is structured to be coupled to a power supply, which supplies a supply voltage (VSUP). The interface common terminal of the interface system 100 is structured to be coupled to a common terminal of a package, which supplies a common potential (e.g., ground).

The data input terminal of the interface system 100 is structured to be coupled to external circuitry, which supplies a digital input signal (DIN). The input supply terminal of the interface system 100 is structured to be coupled to an input power supply, which supplies an input supply voltage (VDDL). The input common terminal of the interface system 100 is structured to be coupled to an input power supply, which supplies an input common voltage (VSSL). In the example of FIG. 1, data of the digital input signal is represented using the input supply and common voltages. For example, the digital input signal represents a logical one if the voltage at the data input terminal of the interface system 100 is closer to the input supply voltage than the input common voltage. In such examples, the digital input signal represents a logical zero if the voltage at the data input terminal of the interface system 100 is closer to the input common voltage than the input supply voltage.

The output common terminal of the interface system 100 is structured to be coupled to an output power supply, which supplies an output supply voltage (VDDH). The output common terminal of the interface system 100 is structured to be coupled to an output power supply, which supplies an output common voltage (VSSH). In the example of FIG. 1, the input supply and common voltages represent logic levels at an input of the interface system 100 and the output supply and common voltages represent logic levels at an output of the interface system 100. In example operations, the output common voltage is a voltage between the voltages at the interface supply and common terminals of the interface system 100. In such example operations, the output supply voltage is structured to be a logic level higher than the output common voltage. For example, the output supply voltage is approximately five volts greater than the output common voltage, which floats between zero (e.g., ground) and the supply voltage of the interface system 100. Although in the example of FIG. 1, the interface system 100 is described as stepping up (e.g., increasing) the logic level of the digital input signal, in some examples, the interface system 100 may be used to step down (e.g., decrease) the logic level of the digital input signal.

The self-correcting level shifter circuitry 110 has a first terminal, a second terminal, a third terminal, a fourth terminal, a fifth terminal, and a sixth terminal. The first terminal of the self-correcting level shifter circuitry 110 is coupled to the data input terminal of the interface system 100, which supplies the digital input signal. The second terminal of the self-correcting level shifter circuitry 110 is coupled to the input supply terminal of the interface system 100, which supplies the input supply voltage. The third terminal of the self-correcting level shifter circuitry 110 is coupled to the input common terminal of the interface system 100, which supplies the input common voltage. The fourth terminal of the self-correcting level shifter circuitry 110 is coupled to the output supply terminal of the interface system 100, which supplies the output supply voltage. The fifth terminal of the self-correcting level shifter circuitry 110 is coupled to the output common terminal of the interface system 100, which supplies the output common voltage. The sixth terminal of the self-correcting level shifter circuitry 110 is coupled to the amplifier circuitry 120. Examples of the self-correcting level shifter circuitry 110 are illustrated and described in connection with FIGS. 2, 3, and 4, below.

The amplifier circuitry 120 has a first terminal and a second terminal. The input terminal of the amplifier circuitry 120 (also referred to as an input terminal) is coupled to the self-correcting level shifter circuitry 110. The second terminal of the amplifier circuitry 120 (also referred to as an output terminal) is coupled to the transistor 130. In some examples, the amplifier circuitry 120 is illustrated or described as amplifier circuitry or buffer circuitry.

The transistor 130 has a first terminal, a second terminal, and a control terminal. The first terminal of the transistor 130 is coupled to an output supply terminal of the interface system 100, which supplies the output supply voltage. The second terminal of the transistor 130 is coupled to the output common terminal of the interface system 100, which supplies the output common voltage. The control terminal of the transistor 130 is coupled to the amplifier circuitry 120.

The driver circuitry 140 has a first terminal and a second terminal. The first terminal of the driver circuitry 140 (also referred to as an input terminal) is coupled to the data input terminal of the interface system 100, which supplies the digital input signal. The second terminal of the driver circuitry 140 (also referred to as an output terminal) is coupled to the inverter 150.

The inverter 150 has a first terminal and a second terminal. The first terminal of the inverter 150 (also referred to as an input terminal) is coupled to the driver circuitry 140. The second terminal of the inverter 150 (also referred to as an output terminal) is coupled to the transistor 160.

The transistor 160 has a first terminal, a second terminal, and a control terminal. The first terminal of the transistor is coupled to the transistor 130 and the output common terminal of the interface system 100, which supplies the output common voltage. The second terminal of the transistor 160 is coupled to a common terminal, which supplies a common potential (e.g., ground). The control terminal of the transistor 160 is coupled to the inverter 150. In some examples, the transistors 130, 160 are referred to as a half bridge, which sets the output common voltage responsive to the digital input signal.

In the example of FIG. 1, the transistor 130 is an n-channel metal-oxide semiconductor field-effect transistor (MOSFET). Alternatively, the transistor 130 may be an n-channel field-effect transistor (FET), an n-channel insulated-gate bipolar transistor (IGBT), an n-channel junction field effect transistor (JFET), an NPN bipolar junction transistors (BJT) or, with slight modifications, a p-type equivalent device.

In example operation, the self-correcting level shifter circuitry 110 receives the digital input signal from an external source, such as programmable circuitry or a processing unit. The self-correcting level shifter circuitry 110 uses the input supply and common voltages to determine a logical state of the digital input signal. The self-correcting level shifter circuitry 110 generates a digital output signal using the determined logical state of the digital input signal and the output supply and common voltages. The amplifier circuitry 120 controls the transistor 130 responsive to the digital output signal. Advantageously, the interface system 100 allows relatively low-voltage digital signals to control relatively high-voltage transistors.

In the example of FIG. 1, the interface system 100 is a half bridge, which generates the output common voltage by switching the transistors 130, 160. In such examples, the output common voltage is a floating voltage between the common potential and the supply voltage of the interface system 100. In such example operations, the self-correcting level shifter circuitry 110 dynamically corrects the digital output signal based on the floating output common voltage. Advantageously, the self-correcting level shifter circuitry 110 corrects the logical state of the digital output signal for voltage swings at the output common terminal. Advantageously, the self-correcting level shifter circuitry 110 increases the accuracy of the digital output signal.

Figure 2:
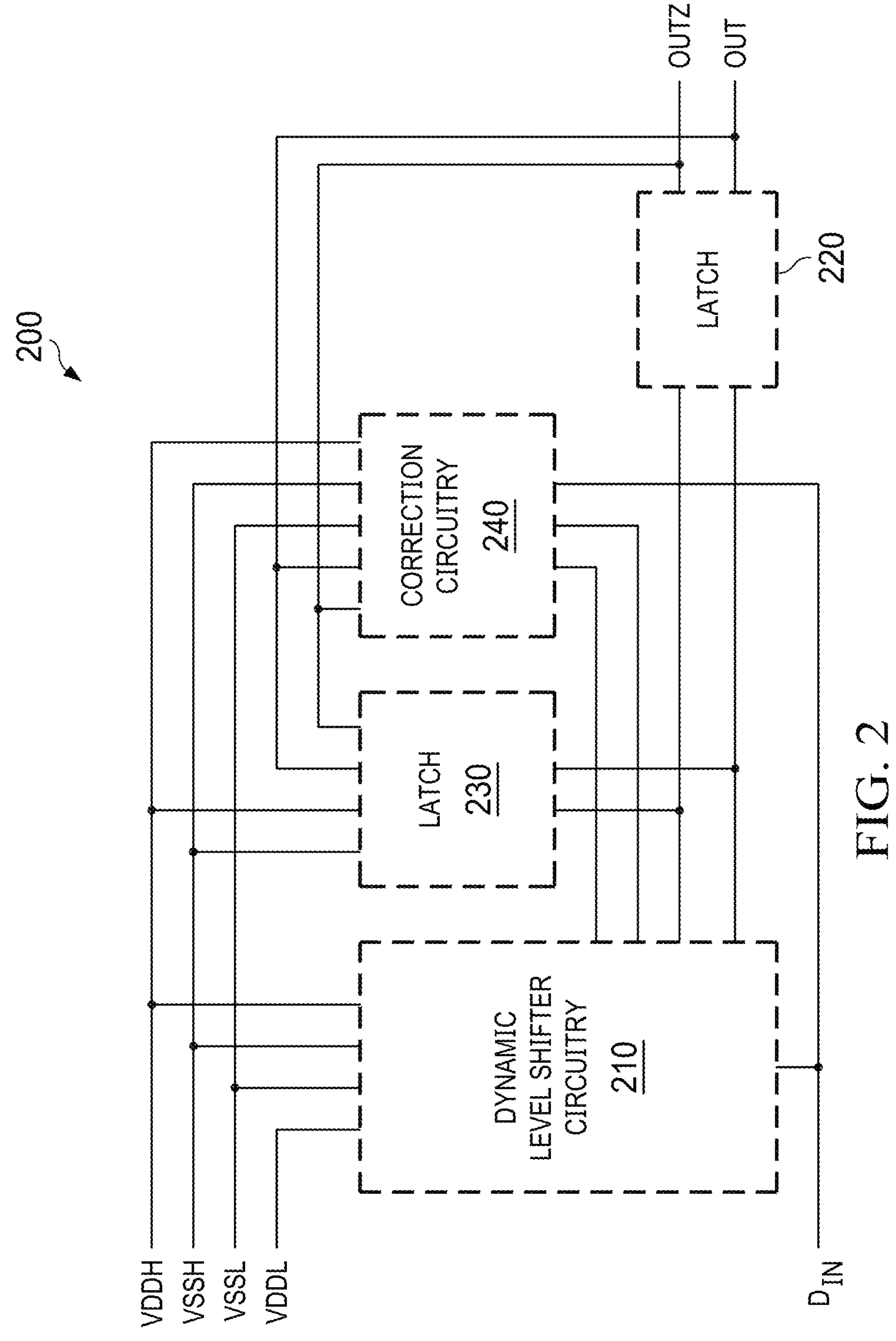
FIG. 2 is a block diagram of an example of the self-correcting level shifter circuitry of FIG. 1.

FIG. 2 is a block diagram of example self-correcting level shifter circuitry 200, which is an example of the self-correcting level shifter circuitry 110 of FIG. 1. In the example of FIG. 2, the self-correcting level shifter circuitry 200 includes dynamic level shifter circuitry 210, a first latch circuitry 220, a second latch circuitry 230, and correction circuitry 240. The self-correcting level shifter circuitry 200 has a data input terminal, a first output terminal, a second output terminal, an input supply terminal, an input common terminal, an output supply terminal, and an output common terminal. The data input terminal of the self-correcting level shifter circuitry 200 is structured to be coupled to external circuitry, which supplies a digital input signal (DIN). The first output terminal of the self-correcting level shifter circuitry 200 is structured to be coupled to external circuitry, which receives a digital output signal (OUT). The second output terminal of the self-correcting level shifter circuitry 200 is structured to be coupled to external circuitry, which receives an inverted digital output signal (OUTZ). In the example of FIG. 2, the inverted digital output signal is an inverted replica of the digital output signal.

The input supply terminal of the self-correcting level shifter circuitry 200 is structured to be coupled to an input power supply, which supplies an input supply voltage (VDDL). The input common terminal of the self-correcting level shifter circuitry 200 is structured to be coupled to an input power supply, which supplies an input common voltage (VSSL). In the example of FIG. 2, logical state of the digital input signal is represented using the input supply and common voltages. For example, the digital input signal represents a logical one if the voltage at the data input terminal of the self-correcting level shifter circuitry 200 is closer to the input supply voltage than the input common voltage. In such examples, the digital input signal represents a logical zero if the voltage at the data input terminal of the self-correcting level shifter circuitry 200 is closer to the input common voltage than the input supply voltage.

The output supply terminal of the self-correcting level shifter circuitry 200 is structured to be coupled to an output power supply, which supplies an output supply voltage (VDDH). The output common terminal of the self-correcting level shifter circuitry 200 is structured to be coupled to an output power supply, which supplies an output common voltage (VSSH). In the example of FIG. 2, the input supply and common voltages represent logic levels at an input of the self-correcting level shifter circuitry 200 and the output supply and common voltages represent logic levels at an output of the self-correcting level shifter circuitry 200. Although in the example of FIG. 2, the self-correcting level shifter circuitry 200 is described as stepping up (e.g., increasing) the logic level of the digital input signal, in some examples, the self-correcting level shifter circuitry 200 may be used to step down (e.g., decrease) the logic level of the digital input signal.

The level shifter circuitry 210 has a first terminal, a second terminal, a third terminal, a fourth terminal, a fifth terminal, a sixth terminal, a seventh terminal, an eighth terminal, and a ninth terminal. The first terminal of the level shifter circuitry 210 is coupled to the data input terminal of the self-correcting level shifter circuitry 200, which supplies the digital input signal (DIN). The second terminal of the level shifter circuitry 210 is coupled to the input supply terminal of the self-correcting level shifter circuitry 200, which supplies the input supply voltage (VDDL). The third terminal of the level shifter circuitry 210 is coupled to the input common terminal of the self-correcting level shifter circuitry 200, which supplies the input common voltage (VSSL). The fourth terminal of the level shifter circuitry 210 is coupled to the output supply terminal of the self-correcting level shifter circuitry 200, which supplies the output supply voltage (VDDH). The fifth terminal of the level shifter circuitry 210 is coupled to the output common terminal of the self-correcting level shifter circuitry 200, which supplies the output common voltage (VSSH). The sixth and seventh terminals of the level shifter circuitry 210 are coupled to the latch circuitry 220, 230. The eighth and ninth terminals of the level shifter circuitry 210 are coupled to the correction circuitry 240. Examples of the level shifter circuitry 210 are illustrated and described in connection with FIGS. 3 and 4, below.

The latch circuitry 220 (also referred to as an output latch) has a first terminal, a second terminal, a third terminal, and a fourth terminal. The first and second terminals of the latch circuitry 220 are coupled to the level shifter circuitry 210 and the latch circuitry 230. The third terminal of the latch circuitry 220 is coupled to the first output terminal of the self-correcting level shifter circuitry 200, which supplies the digital output signal. The fourth terminal of the latch circuitry 220 is coupled to the second output terminal of the self-correcting level shifter circuitry 200, which supplies the inverted digital output signal. An example of the latch circuitry 220 is illustrated and described in connection with FIGS. 3 and 4, below.

The latch circuitry 230 has a first terminal, a second terminal, a third terminal, a fourth terminal, a fifth terminal, and a sixth terminal. The first terminal of the latch circuitry 230 is coupled to the output supply terminal of the self-correcting level shifter circuitry 200, which supplies the output supply voltage. The second terminal of the latch circuitry 230 is coupled to the output common terminal of the self-correcting level shifter circuitry 200, which supplies the output common voltage. The third and fourth terminals of the latch circuitry 230 are coupled to the level shifter circuitry 210 and the latch circuitry 220. The fifth terminal of the latch circuitry 230 is coupled to the first output terminal of the self-correcting level shifter circuitry 200, which supplies the digital output signal. The sixth terminal of the latch circuitry 230 is coupled to the second output terminal of the self-correcting level shifter circuitry 200, which supplies the inverted digital output signal. An example of the latch circuitry 230 is illustrated and described in connection with FIGS. 3 and 4, below.

The correction circuitry 240 has a first terminal, a second terminal, a third terminal, a fourth terminal, a fifth terminal, a sixth terminal, a seventh terminal, and an eighth terminal. The first terminal of the correction circuitry 240 is coupled to the input terminal of the self-correcting level shifter circuitry 200, which supplies the digital input signal. The second terminal of the correction circuitry 240 is coupled to the input common terminal of the self-correcting level shifter circuitry 200, which supplies the input common voltage. The third terminal of the correction circuitry 240 is coupled to the output supply terminal of the self-correcting level shifter circuitry 200, which supplies the output supply voltage. The fourth terminal of the correction circuitry 240 is coupled to the output common terminal of the self-correcting level shifter circuitry 200, which supplies the output common voltage. The fifth and sixth terminals of the correction circuitry 240 are coupled to the level shifter circuitry 210. The seventh terminal of the correction circuitry 240 is coupled to the first output terminal of the self-correcting level shifter circuitry 200, which supplies the digital output signal. The eighth terminal of the correction circuitry 240 is coupled to the second output terminal of the self-correcting level shifter circuitry 200, which supplies the inverted digital output signal. An example of the correction circuitry 240 is illustrated and described in connection with FIGS. 3 and 4, below.

Example operations of the self-correcting level shifter circuitry 200 are illustrated and described in connection with FIGS. 5 and 6, below. Advantageously, the correction circuitry 240 detects adverse states of the digital output signal and the inverse digital output signal in comparison to the digital input signal. Advantageously, the correction circuitry 240 adjusts the level shifter circuitry 210 to correct for adverse states.

Figure 3:
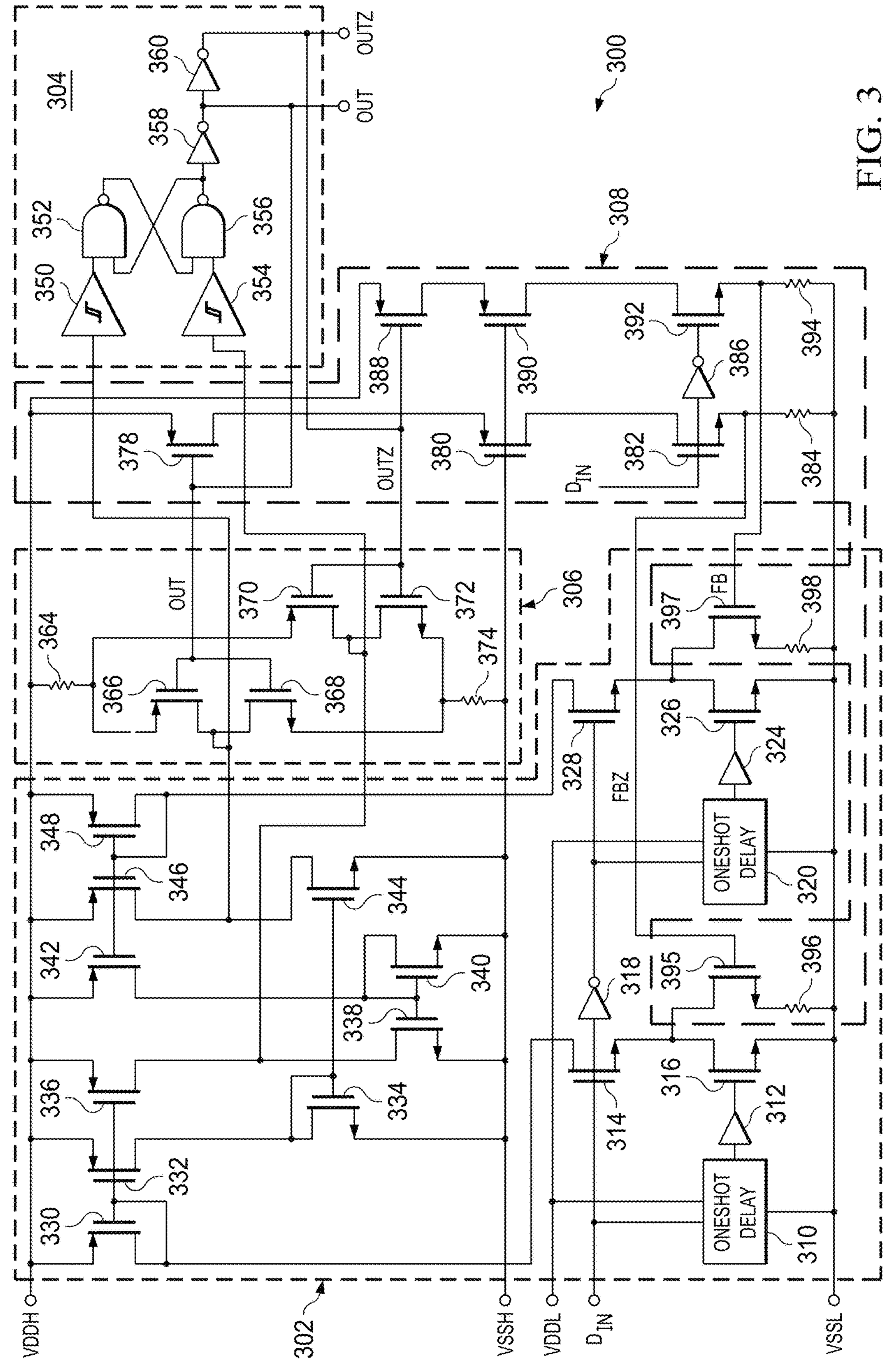
FIG. 3 is a schematic diagram of an example of the self-correcting level shifter circuitry of FIGS. 1 and 2.

FIG. 3 is a schematic diagram of example self-correcting level shifter circuitry 300, which is an example of the self-correcting level shifter circuitry 110, 200 of FIGS. 1 and 2. In the example of FIG. 3, the self-correcting level shifter circuitry 300 includes dynamic level shifter circuitry 302, first latch circuitry 304, second latch circuitry 306, and correction circuitry 308. The example the level shifter circuitry 302 of FIG. 3 includes first example delay circuitry 310, first example buffer circuitry 312, a first example transistor 314, a second example transistor 316, an example inverter 318, second example delay circuitry 320, second example buffer circuitry 324, a third example transistor 326, a fourth example transistor 328, a fifth example transistor 330, a sixth example transistor 332, a seventh example transistor 334, an eighth example transistor 336, a ninth example transistor 338, a tenth example transistor 340, an eleventh example transistor 342, a twelfth example transistor 344, a thirteenth example transistor 346, and a fourteenth example transistor 348. The example latch circuitry 304 of FIG. 3 includes first example amplifier circuitry 350, a first example logic device 352, second example amplifier circuitry 354, a second example logic device 356, a first example inverter 358, and a second example inverter 360. The example latch circuitry 306 of FIG. 3 includes a first example resistor 364, a first example transistor 366, a second example transistor 368, a third example transistor 370, a fourth example transistor 372, and a second example resistor 374. The example correction circuitry 308 of FIG. 3 includes a first example transistor 378, a second example transistor 380, a third example transistor 382, a first example resistor 384, an example inverter 386, a fourth example transistor 388, a fifth example transistor 390, a sixth example transistor 392, a second example resistor 394, a seventh example transistor 395, a third example resistor 396, an eighth example transistor 397, and a fourth example resistor 398.

The self-correcting level shifter circuitry 300 has a data input terminal, a first output terminal, a second output terminal, an input supply terminal, an input common terminal, an output supply terminal, and an output common terminal. The data input terminal of the self-correcting level shifter circuitry 300 is structured to be coupled to external circuitry, which supplies a digital input signal (DIN). The first output terminal of the self-correcting level shifter circuitry 300 is structured to be coupled to external circuitry, which receives a digital output signal (OUT). The second output terminal of the self-correcting level shifter circuitry 300 is structured to be coupled to external circuitry, which receives an inverted digital output signal (OUTZ). In the example of FIG. 3, the inverted digital output signal is an inverted replica of the digital output signal.

The input supply terminal of the self-correcting level shifter circuitry 300 is structured to be coupled to an input power supply, which supplies an input supply voltage (VDDL). The input common terminal of the self-correcting level shifter circuitry 300 is structured to be coupled to an input power supply, which supplies an input common voltage (VSSL). In the example of FIG. 3, the logical state of the digital input signal is represented using the input supply and common voltages. For example, the digital input signal represents a logical one if the voltage at the data input terminal of the self-correcting level shifter circuitry 300 is closer to the input supply voltage than the input common voltage. In such examples, the digital input signal represents a logical zero if the voltage at the data input terminal of the self-correcting level shifter circuitry 300 is closer to the input common voltage than the input supply voltage.

The output supply terminal of the self-correcting level shifter circuitry 300 is structured to be coupled to an output power supply, which supplies an output supply voltage (VDDH). The output common terminal of the self-correcting level shifter circuitry 300 is structured to be coupled to an output power supply, which supplies an output common voltage (VSSH). In the example of FIG. 3, the input supply and common voltages represent logic levels at an input of the self-correcting level shifter circuitry 300 and the output supply and common voltages represent logic levels at an output of the self-correcting level shifter circuitry 300. Although in the example of FIG. 3, the self-correcting level shifter circuitry 300 is described as stepping up (e.g., increasing) the logic level of the digital input signal, in some examples, the self-correcting level shifter circuitry 300 may be used to step down (e.g., decrease) the logic level of the digital input signal.

The level shifter circuitry 302 is coupled to the latch circuitry 304, 306 and the correction circuitry 308. The level shifter circuitry 302 is an example of the level shifter circuitry 210 of FIG. 2. Another example of the level shifter circuitry 210, 302 is illustrated and described in connection with FIG. 4, below. The latch circuitry 304 is coupled to the level shifter circuitry 302, the latch circuitry 306, and the correction circuitry 308. The latch circuitry 304 is an example of the latch circuitry 220 of FIG. 2. The latch circuitry 306 is coupled to the level shifter circuitry 302, the latch circuitry 304, and the correction circuitry 308. The latch circuitry 306 is an example of the latch circuitry 230 of FIG. 2. The correction circuitry 308 is coupled to the level shifter circuitry 302 and the latch circuitry 304, 306. The correction circuitry 308 is an example of the correction circuitry 240 of FIG. 2.

Figure 4:
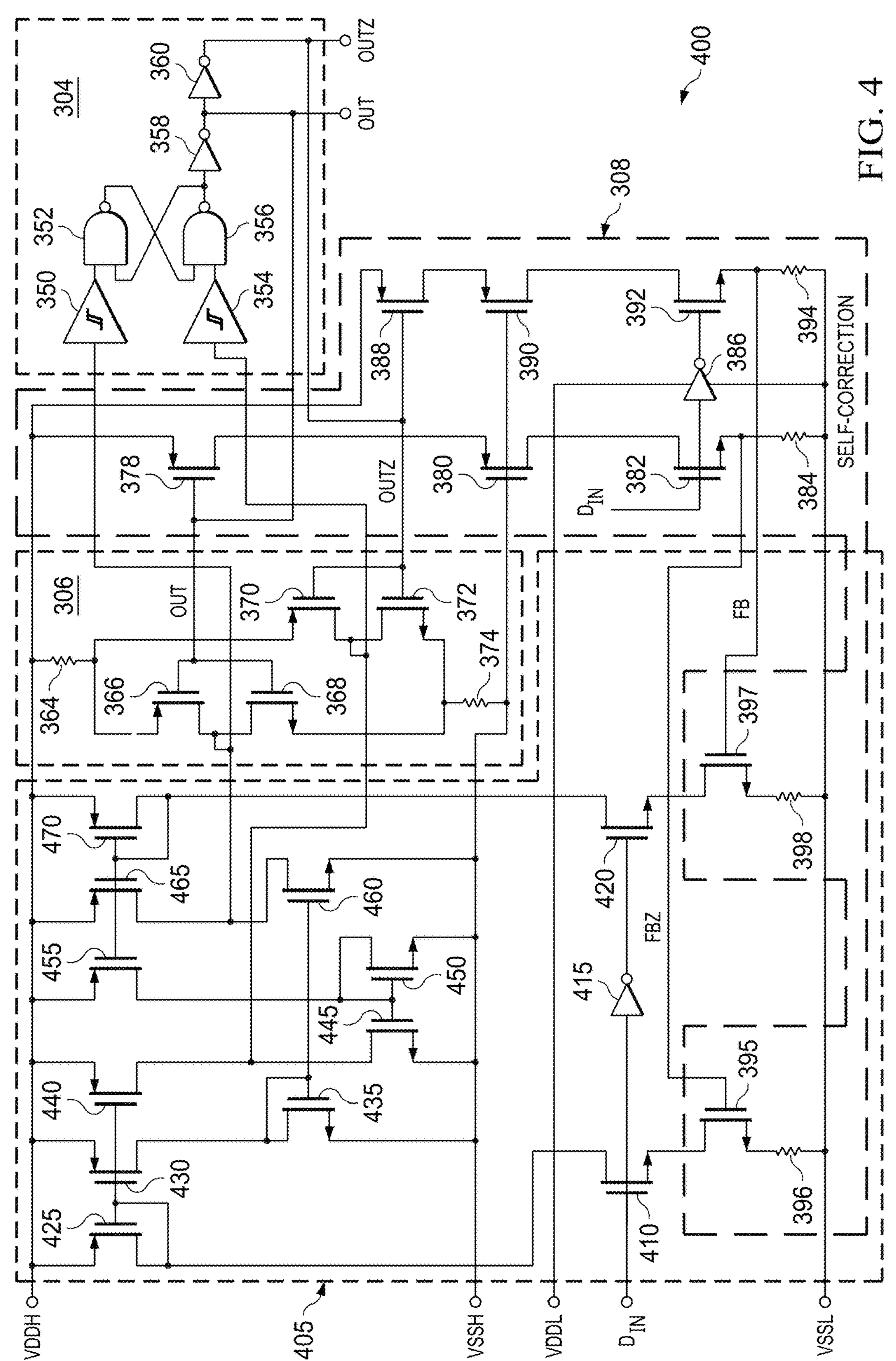
FIG. 4 is a schematic diagram of another example of the self-correcting level shifter circuitry of FIGS. 1, 2, and 3.

The delay circuitry 310 has a first terminal, a second terminal, a third terminal, and a fourth terminal. The first terminal of the delay circuitry 310 is coupled to the data input terminal of the self-correcting level shifter circuitry 300, which supplies the digital input signal. The second terminal of the delay circuitry 310 is coupled to the input supply terminal of the self-correcting level shifter circuitry 300, which supplies the input supply voltage. The third terminal of the delay circuitry 310 is coupled to the input common terminal of the self-correcting level shifter circuitry 300, which supplies the input common voltage. The fourth terminal of the delay circuitry 310 is coupled to the buffer circuitry 312. In the example of FIG. 3, the delay circuitry 310 is one-shot delay circuitry, which generates a pulse responsive to a rising edge of the digital input signal. In some examples, the pulse of the delay circuitry 310 is adjusted to deglitch the digital input signal or allow the output common voltage time to settle. Alternatively, as shown in FIG. 4, the delay circuitry 310 may be removed or replaced with alternative circuitry.

The buffer circuitry 312 has a first terminal and a second terminal. The first terminal of the buffer circuitry 312 is coupled to the delay circuitry 310. The second terminal of the buffer circuitry 312 is coupled to the transistor 316. In some examples, the buffer circuitry 312 is referred to as amplifier circuitry.

The transistor 314 has a first terminal, a second terminal, and a control terminal. The first terminal of the transistor 314 is coupled to the transistors 330, 332, 336. The second terminal of the transistor 314 is coupled to the transistors 316, 395. The control terminal of the transistor 314 is coupled to the data input terminal of the self-correcting level shifter circuitry 300, which supplies the digital input signal.

The transistor 316 has a first terminal, a second terminal, and a control terminal. The first terminal of the transistor 316 is coupled to the transistors 314, 395. The second terminal of the transistor 316 is coupled to the input common terminal of the self-correcting level shifter circuitry 300, which supplies the input common voltage. The control terminal of the transistor 316 is coupled to the buffer circuitry 312.

The inverter 318 has a first terminal and a second terminal. The first terminal of the inverter 318 is coupled to the data input terminal of the self-correcting level shifter circuitry 300, which supplies the digital input signal. The second terminal of the inverter 318 is coupled to the delay circuitry 320 and the transistor 328.

The delay circuitry 320 has a first terminal, a second terminal, a third terminal, and a fourth terminal. The first terminal of the delay circuitry 320 is coupled to the inverter 318. The second terminal of the delay circuitry 320 is coupled to the input supply terminal of the self-correcting level shifter circuitry 300, which supplies the input supply voltage. The third terminal of the delay circuitry 320 is coupled to the input common terminal of the self-correcting level shifter circuitry 300, which supplies the input common voltage. The fourth terminal of the delay circuitry 320 is coupled to the buffer circuitry 324. In the example of FIG. 3, the delay circuitry 320 is one-shot delay circuitry, which generates a pulse responsive to a falling edge of the digital input signal. In some examples, the pulse of the delay circuitry 320 is adjusted to deglitch the digital input signal or allow the output common voltage time to settle.

Alternatively, as shown in FIG. 4, the delay circuitry 320 may be removed or replaced with alternative circuitry.

The buffer circuitry 324 has a first terminal and a second terminal. The first terminal of the buffer circuitry 324 is coupled to the delay circuitry 320. The second terminal of the buffer circuitry 324 is coupled to the transistor 326. In some examples, the buffer circuitry 324 is referred to as amplifier circuitry.

The transistor 326 has a first terminal, a second terminal, and a control terminal. The first terminal of the transistor 326 is coupled to the transistors 328, 397. The second terminal of the transistor 326 is coupled to the input common terminal of the self-correcting level shifter circuitry 300, which supplies the input common voltage. The control terminal of the transistor 326 is coupled to the buffer circuitry 324.

The transistor 328 has a first terminal, a second terminal, and a control terminal. The first terminal of the transistor 328 is coupled to the transistors 346, 348. The second terminal of the transistor 328 is coupled to the transistors 326, 397. The control terminal of the transistor 328 is coupled to the inverter 318 and the delay circuitry 320.

The transistor 330 has a first terminal, a second terminal, and a control terminal. The first terminal of the transistor 330 is coupled to the output supply terminal of the self-correcting level shifter circuitry 300, which supplies the output supply voltage. The second and control terminals of the transistor 330 are coupled to the transistors 314, 332, 336.

The transistor 332 has a first terminal, a second terminal, and a control terminal. The first terminal of the transistor 332 is coupled to the output supply terminal of the self-correcting level shifter circuitry 300, which supplies the output supply voltage. The second terminal of the transistor 332 is coupled to the transistors 334, 344. The control terminal of the transistor 332 is coupled to the transistors 314, 330, 336.

The transistor 334 has a first terminal, a second terminal, and a control terminal. The first and control terminals of the transistor 334 are coupled to the transistors 332, 344. The second terminal of the transistor 334 is coupled to the output common terminal of the self-correcting level shifter circuitry 300, which supplies the output common voltage.

The transistor 336 has a first terminal, a second terminal, and a control terminal. The first terminal of the transistor 336 is coupled to the output supply terminal of the self-correcting level shifter circuitry 300, which supplies the output supply voltage. The second terminal of the transistor 336 is coupled to the transistors 338, 370, 372 and the amplifier circuitry 354. The control terminal of the transistor 336 is coupled to the transistors 314, 330, 332. In the example of FIG. 3, the transistors 330, 332, 336 are structured as current mirror circuitry. In such examples, the transistors 332, 336 are structured to mirror the current flowing through the transistor 330. Alternatively, the level shifter circuitry 302 may be modified to remove or replace the transistors 330, 332, 336 with alternative current mirror circuitry.

The transistor 338 has a first terminal, a second terminal, and a control terminal. The first terminal of the transistor 338 is coupled to the transistors 336, 370, 372 and the amplifier circuitry 354. The second terminal of the transistor 338 is coupled to the output common terminal of the self-correcting level shifter circuitry 300, which supplies the output common voltage. The control terminal of the transistor 338 is coupled to the transistors 340, 342.

The transistor 340 has a first terminal, a second terminal, and a control terminal. The first and control terminals of the transistor 340 are coupled to the transistors 338, 342. The second terminal of the transistor 340 is coupled to the output common terminal of the self-correcting level shifter circuitry 300, which supplies the output common voltage. In the example of FIG. 3, the transistors 338, 340 are structured as current mirror circuitry. In such examples, the transistor 338 is structured to mirror the current flowing through the transistor 340. Alternatively, the level shifter circuitry 302 may be modified to remove or replace the transistors 338, 340 with alternative current mirror circuitry.

The transistor 342 has a first terminal, a second terminal, and a control terminal. The first terminal of the transistor 342 is coupled to the output supply terminal of the self-correcting level shifter circuitry 300, which supplies the output supply voltage. The second terminal of the transistor 342 is coupled to the transistors 338, 340. The control terminal of the transistor 342 is coupled to the transistors 328, 346, 348.

The transistor 344 has a first terminal, a second terminal, and a control terminal. The first terminal of the transistor 344 is coupled to the transistors 346, 366, 368 and the amplifier circuitry 350. The second terminal of the transistor 344 is coupled to the output common terminal of the self-correcting level shifter circuitry 300, which supplies the output common voltage. The control terminal of the transistor 344 is coupled to the transistors 332, 334. In the example of FIG. 3, the transistors 334, 344 are structured as current mirror circuitry. In such examples, the transistor 344 is structured to mirror the current flowing through the transistor 334.

Alternatively, the level shifter circuitry 302 may be modified to remove or replace the transistors 334, 344 with alternative current mirror circuitry.

The transistor 346 has a first terminal, a second terminal, and a control terminal. The first terminal of the transistor 346 is coupled to the output supply terminal of the self-correcting level shifter circuitry 300, which supplies the output supply voltage. The second terminal of the transistor 346 is coupled to the transistors 344, 366, 368 and the amplifier circuitry 350. The control terminal of the transistor 346 is coupled to the transistors 328, 342, 348.

The transistor 348 has a first terminal, a second terminal, and a control terminal. The first terminal of the transistor 348 is coupled to the output supply terminal of the self-correcting level shifter circuitry 300, which supplies the output supply voltage. The second and control terminals of the transistor 348 are coupled to the transistors 328, 342, 346. In the example of FIG. 3, the transistors 342, 346, 348 are structured as current mirror circuitry. In such examples, the transistors 342, 346 are structured to mirror the current flowing through the transistor 348. Alternatively, the level shifter circuitry 302 may be modified to remove or replace the transistors 342, 346, 348 with alternative current mirror circuitry.

The amplifier circuitry 350 has a first terminal and a second terminal. The first terminal of the amplifier circuitry 350 is coupled to the transistors 344, 346, 366, 368. The second terminal of the amplifier circuitry 350 is coupled to the logic device 352. In the example of FIG. 3, the amplifier circuitry 350 is structured as a Schmitt trigger.

The logic device 352 has a first input terminal, a second input terminal, and an output terminal. The first input terminal of the logic device 352 is coupled to the amplifier circuitry 350. The second input terminal of the logic device 352 is coupled to the logic device 356 and the inverter 358. The output terminal of the logic device 352 is coupled to the logic device 356. In the example of FIG. 3, the logic device 352 is a NAND gate. Alternatively, the latch circuitry 304 may be modified to remove or replace the logic device 352 with one or more alternative types of logic devices.

The amplifier circuitry 354 has a first terminal and a second terminal. The first terminal of the amplifier circuitry 354 is coupled to the transistors 336, 338, 370, 372. The second terminal of the amplifier circuitry 354 is coupled to the logic device 356. In the example of FIG. 3, the amplifier circuitry 354 is structured as a Schmitt trigger.

The logic device 356 has a first input terminal, a second input terminal, and an output terminal. The first input terminal of the logic device 356 is coupled to the logic device 352. The second input terminal of the logic device 356 is coupled to the amplifier circuitry 354. The output terminal of the logic device 356 is coupled to the logic device 352 and the inverter 358. In the example of FIG. 3, the logic device 356 is a NAND gate. Alternatively, the latch circuitry 304 may be modified to remove or replace the logic device 356 with one or more alternative types of logic devices.

The inverter 358 has a first terminal and a second terminal. The first terminal of the inverter 358 is coupled to the logic devices 352, 356. The second terminal of the inverter 358 is coupled to the inverter 360, the transistors 366, 368, 378, and the first output terminal of the self-correcting level shifter circuitry 300.

The inverter 360 has a first terminal and a second terminal. The first terminal of the inverter 360 is coupled to the inverter 358, the transistors 366, 368, 378, and the first output terminal of the self-correcting level shifter circuitry 300, which supplies the digital output signal. The second terminal of the inverter 360 is coupled to the transistors 370, 372 and the second output terminal of the self-correcting level shifter circuitry 300.

The resistor 364 has a first terminal and a second terminal. The first terminal of the resistor 364 is coupled to the output supply terminal of the self-correcting level shifter circuitry 300, which supplies the output supply voltage. The second terminal of the resistor 364 is coupled to the transistors 366, 370. In the example of FIG. 3, the resistor 364 is a current limiting resistor, which reduces the strength and parasitic capacitance of the latch circuitry 306. Alternatively, the latch circuitry 306 may be modified to remove or replace the resistor 364 by adjusting the width and length of the channels of the transistors 366, 368, 370, 372.

The transistor 366 has a first terminal, a second terminal, and a control terminal. The first terminal of the transistor 366 is coupled to the resistor 364 and the transistor 370. The second terminal of the transistor 366 is coupled to the transistors 344, 346, 368 and the amplifier circuitry 350. The control terminal of the transistor 366 is coupled to the inverters 358, 360, the transistors 368, 378, and the first output terminal of the self-correcting level shifter circuitry 300, which supplies the digital output signal.

The transistor 368 has a first terminal, a second terminal, and a control terminal. The first terminal of the transistor 368 is coupled to the transistors 344, 346, 366 and the amplifier circuitry 350. The second terminal of the transistor 368 is coupled to the transistor 372 and the resistor 374. The control terminal of the transistor 368 is coupled to the inverters 358, 360, the transistors 366, 378, and the first output terminal of the self-correcting level shifter circuitry 300, which supplies the digital output signal.

The transistor 370 has a first terminal, a second terminal, and a control terminal. The first terminal of the transistor 370 is coupled to the resistor 364 and the transistor 366. The second terminal of the transistor 370 is coupled to the transistors 336, 338 and the amplifier circuitry 354. The control terminal of the transistor 370 is coupled to the inverter 360, the transistors 372, 388, and the second output terminal of the self-correcting level shifter circuitry 300, which supplies the inverted digital output signal.

The transistor 372 has a first terminal, a second terminal, and a control terminal. The first terminal of the transistor 372 is coupled to the transistors 336, 338, 370 and the amplifier circuitry 354. The second terminal of the transistor 372 is coupled to the transistor 368 and the resistor 374. The control terminal of the transistor 372 is coupled to the inverter 360, the transistors 370, 388, and the second output terminal of the self-correcting level shifter circuitry 300, which supplies the inverted digital output signal.

The resistor 374 has a first terminal and a second terminal. The first terminal of the resistor 374 is coupled to the transistors 368, 372. The second terminal of the resistor 374 is coupled to the output common terminal of the self-correcting level shifter circuitry 300, which supplies the output common voltage. In the example of FIG. 3, the resistor 374 is a current limiting resistor, which reduces the strength and parasitic capacitance of the latch circuitry 306. Alternatively, the latch circuitry 306 may be modified to remove or replace the resistor 374 by adjusting the width and length of the channels of the transistors 366, 368, 370, 372.

The transistor 378 has a first terminal, a second terminal, and a control terminal. The first terminal of the transistor 378 is coupled to the output supply terminal of the self-correcting level shifter circuitry 300, which supplies the output supply voltage. The second terminal of the transistor 378 is coupled to the transistor 380. The control terminal of the transistor 378 is coupled to the inverters 358, 360, the transistors 366, 368, and the first output terminal of the self-correcting level shifter circuitry 300, which supplies the digital output signal.

The transistor 380 has a first terminal, a second terminal, and a control terminal. The first terminal of the transistor 380 is coupled to the transistor 378. The second terminal of the transistor 380 is coupled to the transistor 382. The control terminal of the transistor 380 is coupled to the output common terminal of the self-correcting level shifter circuitry 300, which supplies the output common voltage.

The transistor 382 has a first terminal, a second terminal, and a control terminal. The first terminal of the transistor 382 is coupled to the transistor 380. The second terminal of the transistor 382 is coupled to the resistor 384 and the transistor 395. The control terminal of the transistor 382 is coupled to the input terminal of the self-correcting level shifter circuitry 300, which supplies the digital input signal.

The resistor 384 has a first terminal and a second terminal. The first terminal of the resistor 384 is coupled to the transistors 382, 395. The second terminal of the resistor 384 is coupled to the input common terminal of the self-correcting level shifter circuitry 300, which supplies the input common voltage.

The inverter 386 has a first terminal and a second terminal. The first terminal of the inverter 386 is coupled to the input terminal of the self-correcting level shifter circuitry 300, which supplies the digital input signal. The second terminal of the inverter 386 is coupled to the transistor 392. In some examples, the transistor 392 is coupled to the inverter 318, which supplies the inverted digital input signal. In such examples, the inverter 386 may be removed.

The transistor 388 has a first terminal, a second terminal, and a control terminal. The first terminal of the transistor 388 is coupled to the output supply terminal of the self-correcting level shifter circuitry 300, which supplies the output supply voltage. The second terminal of the transistor 388 is coupled to the transistor 390. The control terminal of the transistor 388 is coupled to the inverter 360, the transistors 370, 372, and the second output terminal of the self-correcting level shifter circuitry 300, which supplies the inverted digital output signal.

The transistor 390 has a first terminal, a second terminal, and a control terminal. The first terminal of the transistor 390 is coupled to the transistor 388. The second terminal of the transistor 390 is coupled to the transistor 392. The control terminal of the transistor 390 is coupled to the output common terminal of the self-correcting level shifter circuitry 300, which supplies the output common voltage.

The transistor 392 has a first terminal, a second terminal, and a control terminal. The first terminal of the transistor 392 is coupled to the transistor 390. The second terminal of the transistor 392 is coupled to the resistor 394 and the transistor 397. The control terminal of the transistor 392 is coupled to the inverter 386.

The resistor 394 has a first terminal and a second terminal. The first terminal of the resistor 394 is coupled to the transistors 392, 397. The second terminal of the resistor 394 is coupled to the input common terminal of the self-correcting level shifter circuitry 300, which supplies the input common voltage.

The transistor 395 has a first terminal, a second terminal, and a control terminal. The first terminal of the transistor 395 is coupled to the transistors 314, 316. The second terminal of the transistor 395 is coupled to the resistor 396. The control terminal of the transistor 395 is coupled to the transistor 382 and the resistor 384. The resistor 396 has a first terminal and a second terminal. The first terminal of the resistor 396 is coupled to the transistor 395. The second terminal of the resistor 396 is coupled to the input common terminal of the self-correcting level shifter circuitry 300, which supplies the input common voltage. In the example of FIG. 3, the transistor 395 and the resistor 396 are structured as current source circuitry, which sinks a current responsive to a voltage across the resistor 384. Alternatively, the correction circuitry 308 may be modified to replace the transistor 395 and the resistor 396 with current source circuitry.

The transistor 397 has a first terminal, a second terminal, and a control terminal. The first terminal of the transistor 397 is coupled to the transistors 326, 328. The second terminal of the transistor 397 is coupled to the resistor 398. The control terminal of the transistor 397 is coupled to the transistor 392 and the resistor 394. The resistor 398 has a first terminal and a second terminal. The first terminal of the resistor 398 is coupled to the transistor 397. The second terminal of the resistor is coupled to the input common terminal of the self-correcting level shifter circuitry 300, which supplies the input common voltage. In the example of FIG. 3, the transistor 397 and the resistor 398 are structured as current source circuitry, which sinks a current responsive to a voltage across the resistor 394. Alternatively, the correction circuitry 308 may be modified to replace the transistor 397 and the resistor 398 with current source circuitry.

In the example of FIG. 3, the transistors 314, 316, 326, 328, 334, 338, 340, 344, 368, 372, 382, 392, 395, 397 are n-channel MOSFETs. Alternatively, the transistors 314, 316, 326, 328, 334, 338, 340, 344, 368, 372, 382, 392, 395, 397 may be n-channel FETs, n-channel IGBTs, n-channel JFETs, NPN BJTs, or, with slight modifications, p-type equivalent devices. In the example of FIG. 3, the transistors 330, 332, 336, 342, 346, 348, 366, 370, 378, 380, 388, 390 are p-channel MOSFETs. Alternatively, the transistors 330, 332, 336, 342, 346, 348, 366, 370, 378, 380, 388, 390 may be p-channel FETs, p-channel IGBTs, p-channel JFETs, PNP BJTs, or, with slight modifications, N-type equivalent devices. The transistors 314, 316, 326, 328, 330, 332, 334,336, 338, 340, 342, 344, 346, 348, 366, 368, 370, 372, 378, 380, 382, 388, 390, 392, 395, 397 may be depletion mode devices, drain-extended devices, enhancement mode devices, natural transistors or other type of device structure transistors. Furthermore, the transistors 314, 316, 326, 328, 330, 332, 334,336, 338, 340, 342, 344, 346, 348, 366, 368, 370, 372, 378, 380, 382, 388, 390, 392, 395, 397 may be implemented in/over a silicon substrate (Si), a silicon carbide substrate (SiC), a gallium nitride substrate (GaN) or a gallium arsenide substrate (GaAs).

Example operations of the self-correcting level shifter circuitry 300 are illustrated and described in connection with FIGS. 5 and 6, below. Advantageously, the correction circuitry 308 uses the transistors 395, 397 to correct the digital output signal based on a comparison of the digital output signal to the digital input signal. Advantageously, the correction circuitry 308 corrects the digital output signal during steady state operations of the self-correcting level shifter circuitry 300.

FIG. 4 is a schematic diagram of example self-correcting level shifter circuitry 400, which is another example of the self-correcting level shifter circuitry 110, 200, 300 of FIGS. 1, 2, and 3. In the example of FIG. 4, the self-correcting level shifter circuitry 400 includes the latch circuitry 304, 306 of FIG. 3, the correction circuitry 308 of FIG. 3, and example dynamic level shifter circuitry 405. The example latch circuitry 304 of FIG. 4 includes the amplifier circuitry 350,

354 of FIG. 3, the logic devices 352, 356 of FIG. 3, and the inverters 358, 360 of FIG. 3. The example latch circuitry 306 of FIG. 4 includes the resistors 364, 374 of FIG. 3 and the transistors 366, 368, 370, 372 of FIG. 3. The example correction circuitry 308 of FIG. 4 includes the transistors 378, 380, 382, 388, 390, 392, 395, 397 of FIG. 3, the resistors 384, 394, 396, 398 of FIG. 3, and the inverter 386 of FIG. 3. The example level shifter circuitry 405 of FIG. 4 includes a first example transistor 410, an example inverter 415, a second example transistor 420, a third example transistor 425, a fourth example transistor 430, a fifth example transistor 435, a sixth example transistor 440, a seventh example transistor 445, an eighth example transistor 450, a ninth example transistor 455, a tenth example transistor 460, an eleventh example transistor 465, and a twelfth example transistor 470.

The self-correcting level shifter circuitry 400 has a data input terminal, a first output terminal, a second output terminal, an input supply terminal, an input common terminal, an output supply terminal, and an output common terminal. The data input terminal of the self-correcting level shifter circuitry 400 is structured to be coupled to external circuitry, which supplies a digital input signal (DIN). The first output terminal of the self-correcting level shifter circuitry 300 is structured to be coupled to external circuitry, which receives a digital output signal (OUT). The second output terminal of the self-correcting level shifter circuitry 400 is structured to be coupled to external circuitry, which receives an inverted digital output signal (OUTZ). In the example of FIG. 4, the inverted digital output signal is an inverted replica of the digital output signal.

The input supply terminal of the self-correcting level shifter circuitry 400 is structured to be coupled to an input power supply, which supplies an input supply voltage (VDDL). The input common terminal of the self-correcting level shifter circuitry 400 is structured to be coupled to an input power supply, which supplies an input common voltage (VSSL). In the example of FIG. 4, the logical state of the digital input signal is represented using the input supply and common voltages. For example, the digital input signal represents a logical one if the voltage at the data input terminal of the self-correcting level shifter circuitry 400 is closer to the input supply voltage than the input common voltage. In such examples, the digital input signal represents a logical zero if the voltage at the data input terminal of the self-correcting level shifter circuitry 400 is closer to the input common voltage than the input supply voltage.

The output supply terminal of the self-correcting level shifter circuitry 400 is structured to be coupled to an output power supply, which supplies an output supply voltage (VDDH). The output common terminal of the self-correcting level shifter circuitry 400 is structured to be coupled to an output power supply, which supplies an output common voltage (VSSH). In the example of FIG. 4, the input supply and common voltages represent logic levels at an input of the self-correcting level shifter circuitry 400 and the output supply and common voltages represent logic levels at an output of the self-correcting level shifter circuitry 400. Although in the example of FIG. 4, the self-correcting level shifter circuitry 400 is described as stepping up (e.g., increasing) the logic level of the digital input signal, in some examples, the self-correcting level shifter circuitry 400 may be used to step down (e.g., decrease) the logic level of the digital input signal.

The level shifter circuitry 405 is coupled to the latch circuitry 304, 306 and the correction circuitry 308. The level shifter circuitry 405 is another example of the level shifter circuitry 210, 302 of FIGS. 2 and 3.

The transistor 410 has a first terminal, a second terminal, and a control terminal. The first terminal of the transistor 410 is coupled to the transistors 425, 430, 440. The second terminal of the transistor 410 is coupled to the transistor 395. The control terminal of the transistor 410 is coupled to the data input terminal of the self-correcting level shifter circuitry 400, which supplies the digital input signal.

The inverter 415 has a first terminal and a second terminal. The first terminal of the inverter 415 is coupled to the data input terminal of the self-correcting level shifter circuitry 400, which supplies the digital input signal. The second terminal of the inverter 415 is coupled to the transistor 420.

The transistor 420 has a first terminal, a second terminal, and a control terminal. The first terminal of the transistor 420 is coupled to the transistors 455, 465, 470. The second terminal of the transistor 420 is coupled to the transistor 397. The control terminal of the transistor 420 is coupled to the inverter 415.

The transistor 425 has a first terminal, a second terminal, and a control terminal. The first terminal of the transistor 425 is coupled to the output supply terminal of the self-correcting level shifter circuitry 400, which supplies the output supply voltage. The second and control terminals of the transistor 425 are coupled to the transistors 410, 430, 440.

The transistor 430 has a first terminal, a second terminal, and a control terminal. The first terminal of the transistor 430 is coupled to the output supply terminal of the self-correcting level shifter circuitry 400, which supplies the output supply voltage. The second terminal of the transistor 430 is coupled to the transistors 435, 460. The control terminal of the transistor 430 is coupled to the transistors 410, 430, 440.

The transistor 435 has a first terminal, a second terminal, and a control terminal. The first and control terminals of the transistor 435 are coupled to the transistors 430, 460. The second terminal of the transistor 435 is coupled to the output common terminal of the self-correcting level shifter circuitry 400, which supplies the output common voltage.

The transistor 440 has a first terminal, a second terminal, and a control terminal. The first terminal of the transistor 440 is coupled to the output supply terminal of the self-correcting level shifter circuitry 400, which supplies the output supply voltage. The second terminal of the transistor 440 is coupled to the transistors 370, 372, 445 and the amplifier circuitry 354. The control terminal of the transistor 440 is coupled to the transistors 410, 425, 430. In the example of FIG. 4, the transistors 425, 430, 440 are structured as current mirror circuitry. In such examples, the transistors 430, 440 are structured to mirror the current flowing through the transistor 425. Alternatively, the level shifter circuitry 405 may be modified to remove or replace the transistors 425, 430, 440 with alternative current mirror circuitry.

The transistor 445 has a first terminal, a second terminal, and a control terminal. The first terminal of the transistor 445 is coupled to the transistors 370, 372, 440 and the amplifier circuitry 354. The second terminal of the transistor 445 is coupled to the output common terminal of the self-correcting level shifter circuitry 400, which supplies the output common voltage. The control terminal of the transistor 445 is coupled to the transistors 450, 455.

The transistor 450 has a first terminal, a second terminal, and a control terminal. The first and control terminals of the transistor 450 are coupled to the transistors 445, 455. The second terminal of the transistor 450 is coupled to the output common terminal of the self-correcting level shifter circuitry 400, which supplies the output common voltage. In the example of FIG. 4, the transistors 445, 450 are structured as current mirror circuitry. In such examples, the transistor 445 is structured to mirror the current flowing through the transistor 450. Alternatively, the level shifter circuitry 405 may be modified to remove or replace the transistors 445, 450 with alternative current mirror circuitry.

The transistor 455 has a first terminal, a second terminal, and a control terminal. The first terminal of the transistor 455 is coupled to the output supply terminal of the self-correcting level shifter circuitry 400, which supplies the output supply voltage. The second terminal of the transistor 455 is coupled to the transistors 445, 450. The control terminal of the transistor 455 is coupled to the transistors 420, 465, 470.

The transistor 460 has a first terminal, a second terminal, and a control terminal. The first terminal of the transistor 460 is coupled to the transistors 366, 368, 465 and the amplifier circuitry 350. The second terminal of the transistor 460 is coupled to the output common terminal of the self-correcting level shifter circuitry 400, which supplies the output common voltage. The control terminal of the transistor 460 is coupled to the transistors 430, 435. In the example of FIG. 4, the transistors 435, 460 are structured as current mirror circuitry. In such examples, the transistor 460 is structured to mirror the current flowing through the transistor 435. Alternatively, the level shifter circuitry 405 may be modified to remove or replace the transistors 435, 460 with alternative current mirror circuitry.

The transistor 465 has a first terminal, a second terminal, and a control terminal. The first terminal of the transistor 465 is coupled to the output supply terminal of the self-correcting level shifter circuitry 400, which supplies the output supply voltage. The second terminal of the transistor 465 is coupled to the transistors 366, 368, 460 and the amplifier circuitry 350. The control terminal of the transistor 465 is coupled to the transistors 420, 455, 470.

The transistor 470 has a first terminal, a second terminal, and a control terminal. The first terminal of the transistor 470 is coupled to the output supply terminal of the self-correcting level shifter circuitry 400, which supplies the output supply voltage. The second and control terminals of the transistor 470 are coupled to the transistors 420, 455, 465. In the example of FIG. 4, the transistors 455, 465, 470 are structured as current mirror circuitry. In such examples, the transistors 455, 465 are structured to mirror the current flowing through the transistor 470. Alternatively, the level shifter circuitry 405 may be modified to remove or replace the transistors 455, 465, 470 with alternative current mirror circuitry.

In the example of FIG. 4, the transistors 368, 372, 382, 392, 395, 397, 410, 420, 435, 445, 450, 460 are n-channel MOSFETs. Alternatively, the transistors 368, 372, 382, 392, 395, 397, 410, 420, 435, 445, 450, 460 may be n-channel FETs, n-channel IGBTs, n-channel JFETs, NPN BJTs, or, with slight modifications, p-type equivalent devices. In the example of FIG. 4, the transistors 366, 370, 378, 380, 388, 390, 425, 430, 440, 455, 465, 470 are p-channel MOSFETs. Alternatively, the transistors 366, 370, 378, 380, 388, 390, 425, 430, 440, 455, 465, 470 may be p-channel FETs, p-channel IGBTs, p-channel JFETs, PNP BJTs, or, with slight modifications, N-type equivalent devices. The transistors 366, 368, 370, 372, 378, 380, 382, 388, 390, 392, 395, 397, 410, 420, 425, 430, 435, 440, 445, 450, 455, 460, 465, 470 may be depletion mode devices, drain-extended devices, enhancement mode devices, natural transistors or other type of device structure transistors. Furthermore, the transistors 366, 368, 370, 372, 378, 380, 382, 388, 390, 392, 395, 397, 410, 420, 425, 430, 435, 440, 445, 450, 455, 460, 465, 470 may be implemented in/over a silicon substrate (Si), a silicon carbide substrate (SiC), a gallium nitride substrate (GaN) or a gallium arsenide substrate (GaAs).

Example operations of the self-correcting level shifter circuitry 400 are illustrated and described in connection with FIGS. 5 and 6, below. Unlike the level shifter circuitry 302 of FIG. 3, the level shifter circuitry 405 of FIG. 4 uses the correction circuitry 308 instead of the delay circuitry 310, 320 of FIG. 3. Advantageously, removing the delay circuitry 310, 320 decreases the system-on-chip size of the self-correcting level shifter circuitry 400.

Figure 5:
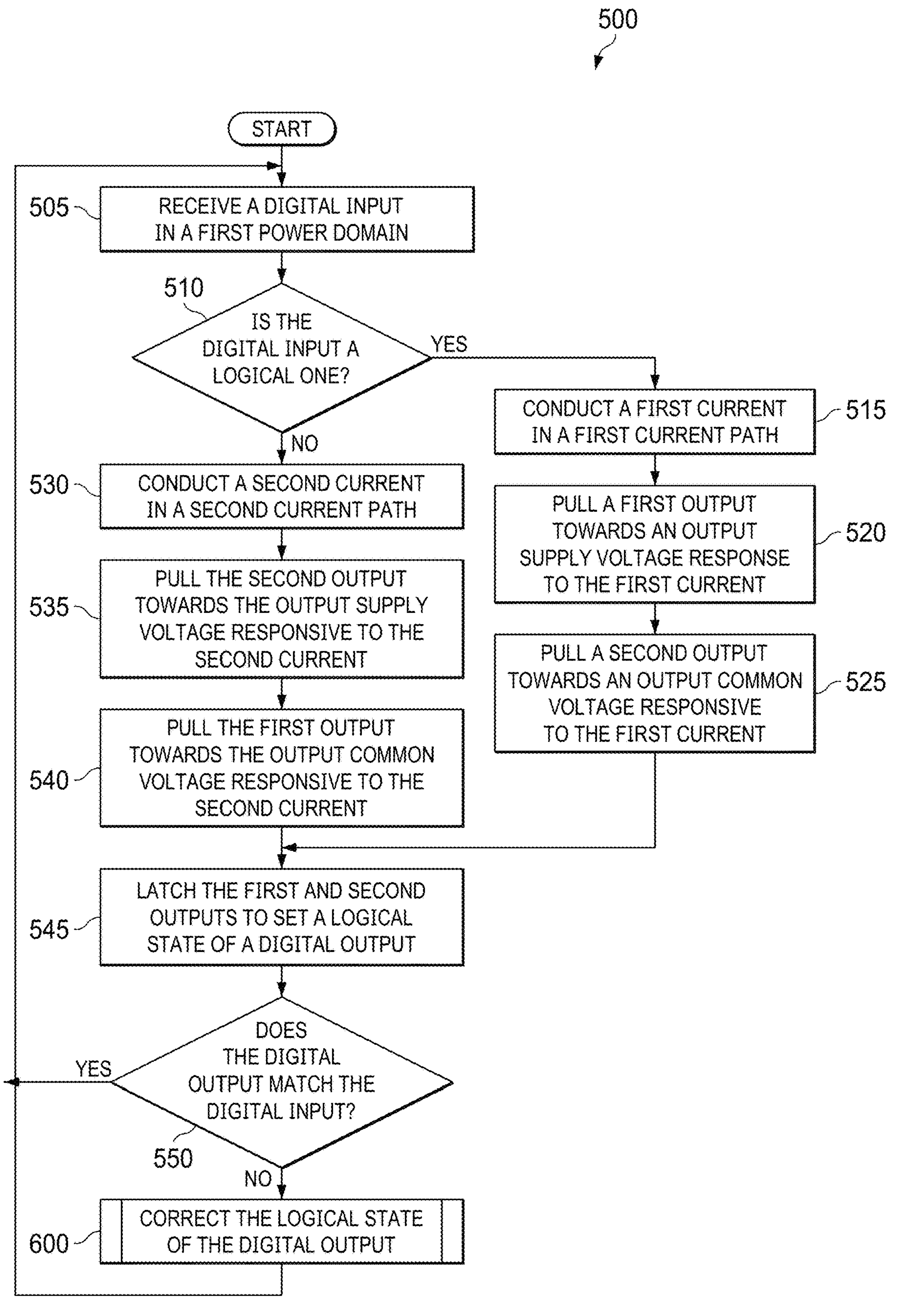
FIG. 5 is a flowchart representative of example operations that may be at least one of executed, instantiated, or performed using an example implementation of the self-correcting level shifter circuitry of FIGS. 1, 2, 3, and 4.

FIG. 5 is a flowchart representative of example operations 500 that may be at least one of executed, instantiated, or performed using an example implementation of the self-correcting level shifter circuitry 110, 200, 300, 400 of FIGS. 1, 2, 3, and 4. The example operations 500 of FIG. 5 begin at Block 510, at which the self-correcting level shifter circuitry 110, 200, 300, 400 receives a digital input in a first power domain. (Block 505). In some examples, the self-correcting level shifter circuitry 110, 200, 300, 400 receives a digital input signal at a data input terminal. In such examples, external circuitry generates the digital input signal using an input supply voltage and an input common voltage. The input supply and common voltages represent the logic levels of the external circuitry.

The level shifter circuitry 210, 302, 405 of FIGS. 2, 3, and 4 determines if the digital input is a logical one. (Block 510). In example operations of the level shifter circuitry 302, the delay circuitry 310 of FIG. 3, the transistor 314 of FIG. 3, and the inverter 318 of FIG. 3 receive the digital input signal at the input terminal of the self-correcting level shifter circuitry 300. The delay circuitry 310 and the buffer circuitry 312 of FIG. 3 control the transistor 316 responsive to the digital input signal. The inverter 318 generates an inverted digital input signal, which the delay circuitry 320 of FIG. 3 and the buffer circuitry 324 of FIG. 3 use to control the transistor 326 of FIG. 3. In such example operations, the delay circuitry 310, 320 generate a relatively short duration pulse responsive to edges of the digital input signal. The delay circuitry 310, 320 controls the transistors 316, 326 using the relatively short duration pulses. The duration of the pulses from the delay circuitry 310, 320 allow ripples on the output supply voltage and the output common voltage to settle before reducing the signal strength of the control of the transistors 316, 326. Advantageously, reducing signal strength of the control of the transistor 316, 326 between edges of the digital input signal reduces the quiescent current.

In example operations of the level shifter circuitry 405, the transistor 410 of FIG. 4 and the inverter 415 of FIG. 4 receive the digital input signal at the input terminal of the self-correcting level shifter circuitry 400. The digital input signal controls the transistor 410 and the inverter 415 generates an inverted digital input signal to control the transistor 420 of FIG. 4. Unlike the level shifter circuitry 302, the level shifter circuitry 405 is modified to exclude the delay circuitry 310, 320, the buffer circuitry 312, 324, and the transistors 316, 326. Instead, the correction circuitry 308 of FIGS. 3 and 4 causes the level shifter circuitry 405 to respond to changes in the digital input signal responsive to detecting that the digital output signal no longer accurately reflects the digital input signal. Advantageously, excluding the delay circuitry 310, 320, the buffer circuitry 312, 324, and the transistors 316, 326 decreases the system-on-chip (SoC) size.

When the digital input is a logical one (e.g. Block 510 returns a result of YES), the level shifter circuitry 210, 302, 405 conducts a first current in a first current path. (Block 515). In example operations of the level shifter circuitry 302, the transistors 314, 316 conduct a first current from the transistor 330 of FIG. 3 responsive to a rising edge of the digital input signal. In such examples, the delay circuitry 310 generates a pulse responsive to the rising edge, which causes the first current to conduct for a short duration of time. Advantageously, the delay circuitry 310 reduces the quiescent current by only conducting the first current for the short duration after the rising edge. Also, the transistors 326, 328 are non-conducting responsive to the inverted digital input signal being a logical zero. In such example operations, the transistors 332, 336 of FIG. 3 mirror the first current through the transistor 330.

In example operations of the level shifter circuitry 405, the transistors 395, 410 conduct a first current from the transistor 425 of FIG. 4 responsive to the digital input signal being a logical one and the digital output signal being a logical zero. In such examples, the transistor 395 causes the first current to conduct until the latch circuitry 220, 304 updates the digital output signal. Advantageously, the correction circuitry 308 reduces the quiescent current by only conducting the first current until the digital output signal is updated. Also, the transistors 397, 420 are non-conducting responsive to the inverted digital input signal being a logical zero. In such example operations, the transistors 430, 440 of FIG. 4 mirror the first current through the transistor 425.

The level shifter circuitry 210, 302, 405 pulls a first output towards an output supply voltage responsive to the first current. (Block 520). In example operations, the transistors 338, 340, 342, 346, 348 of FIG. 3 are non-conducting responsive to the lack of current conduction by the transistors 328, 326. In such example operations, the transistor 336 uses the first current to pull the input of the amplifier circuitry 354 of FIGS. 3 and 4 towards the output supply voltage. Similarly, the transistors 445, 450, 455, 465, 470 of FIG. 4 are non-conducting responsive to the lack of current conduction by the transistor 420. In such example operations, the transistor 440 uses the first current to pull the input of the amplifier circuitry 354 towards the output supply voltage.

The level shifter circuitry 210, 302, 405 pulls a second output towards an output common voltage responsive to the first current. (Block 525). In example operations, the transistors 346, 348 are non-conducting responsive to the lack of current conduction by the transistors 328, 326. In such example operations, the transistor 344 of FIG. 3 mirrors the first current through the transistors 332, 334 of FIG. 3, which pulls the input of the amplifier circuitry 350 of FIGS. 3 and 4 towards the output common voltage. Similarly, the transistors 465, 470 are non-conducting responsive to the lack of current conduction by the transistor 420. In such example operations, the transistor 460 of FIG. 4 mirrors the first current through the transistors 430, 435 of FIG. 4, which pulls the input of the amplifier circuitry 350 towards the output common voltage.

When the digital input is not a logical one (e.g. Block 510 returns a result of NO), the level shifter circuitry 210, 302, 405 conducts a second current in a second current path. (Block 530). In example operations of the level shifter circuitry 302, the transistors 326, 328 conduct a second current from the transistor 348 responsive to a rising edge of the inverted digital input signal. In such examples, the delay circuitry 320 generates a pulse responsive to the rising edge, which causes the second current to conduct for a short duration of time. Advantageously, the delay circuitry 320 reduces the quiescent current by only conducting the second current for the short duration after the rising edge. Also, the transistors 314, 316 are non-conducting responsive to the digital input signal being a logical zero. In such example operations, the transistors 342, 346 mirror the second current through the transistor 348.

In example operations of the level shifter circuitry 405, the transistors 397, 420 conduct a second current from the transistor 470 responsive to a rising edge of the inverted digital input signal. In such examples, the transistor 397 causes the second current to conduct until the latch circuitry 220, 304 updates the digital output signal. Advantageously, the correction circuitry 308 reduces the quiescent current by only conducting the second current until the digital output signal is updated. Also, the transistor 410 is non-conducting responsive to the digital input signal being a logical zero. In such example operations, the transistors 455, 465 mirror the first current through the transistor 470.

The level shifter circuitry 210, 302, 405 pulls the second output towards the output supply voltage responsive to the second current. (Block 535). In example operations, the transistors 330, 332, 334, 336, 344 are non-conducting responsive to the lack of current conduction by the transistors 314, 316. In such example operations, the transistor 346 uses the second current to pull the input of the amplifier circuitry 350 towards the output supply voltage. Similarly, the transistors 425, 430, 440, 435, 460 are non-conducting responsive to the lack of current conduction by the transistor 410. In such example operations, the transistor 465 uses the second current to pull the input of the amplifier circuitry 350 towards the output supply voltage.

The level shifter circuitry 210, 302, 405 pulls the first output towards the output common voltage responsive to the second current. (Block 540). In example operations, the transistors 330, 336 are non-conducting responsive to the lack of current conduction by the transistors 314, 316. In such example operations, the transistor 338 mirrors the second current through the transistors 340, 342, which pulls the input of the amplifier circuitry 354 towards the output common voltage. Similarly, the transistors 425, 440 are non-conducting responsive to the lack of current conduction by the transistor 410. In such example operations, the transistor 445 mirrors the second current through the transistors 450, 455, which pulls the input of the amplifier circuitry 354 towards the output common voltage.

The latch circuitry 220, 230, 304, 306 latch the first and second outputs to set a logical state of a digital output. (Block 545). In example operations, the amplifier circuitry 350, 354 receive the first and second outputs from the level shifter circuitry 210, 302, 405. In some examples, the amplifier circuitry 350, 354 are Schmitt triggers, which generate a logical one or logical zero based on a comparison of an input voltage to a reference voltage. The logic devices 352, 356 of FIGS. 3 and 4 latch the outputs of the amplifier circuitry 350, 354. The inverters 358, 360 of FIGS. 3 and 4 generate the digital output signal and the inverted digital output signal by inverting an output of the logic device 356. Advantageously, the latch circuitry 220, 304 prevent the digital output signal from floating.

Also, the digital output signal controls the transistors 366, 368 of FIGS. 3 and 4 and the inverted digital output signal controls the transistors 370, 372. When the digital output signal is a logical one, the transistor 368 pulls the second output of level shifter circuitry 210, 302, 405 towards the output common voltage and the transistor 370 pulls the first output of the level shifter circuitry 210, 302, 405 towards the output supply voltage. When the digital output signal is a logical zero, the transistor 366 pulls the second output of level shifter circuitry 210, 302, 405 towards the output supply voltage and the transistor 372 pulls the first output of the level shifter circuitry 210, 302, 405 towards the output common voltage. Advantageously, the latch circuitry 230, 306 increases the noise immunity of the digital output signal after the latch circuitry 220, 304 set the logical state.

In example operation, after the latch circuitry 306 latches the digital output signal and the inverted digital output signal, the transistors 366, 368, 370, 372 hold the inputs of the amplifier circuitry 350, 354. The transistors 330, 348, 425, 470 no longer need to conduct current to set the digital output signal. In such example operations, the duration of the pulses from the delay circuitry 310, 320 are determined based on the time the latch circuitry 306 takes to latch the updated digital output signals. Advantageously, the latch circuitry 306 allows the level shifter circuitry 302, 405 to conduct current when adjusting the digital output signal. Advantageously, during steady state operations (e.g., between edges of the digital input signal), the latch circuitry 306 reduces the quiescent current of the level shifter circuitry 302, 405.

The correction circuitry 240, 308 determines if the digital output matches the digital input. (Block 550). In example operations, the digital output signal controls the transistor 378 of FIGS. 3 and 4 and the inverted digital output signal controls the transistor 388 of FIGS. 3 and 4. Also, the digital input signal controls the transistor 382 of FIGS. 3 and 4 and the inverted digital input signal controls the transistor 392 of FIGS. 3 and 4. In some examples, the transistors 378, 388 are drain-extended transistors, which allow the transistors 378, 388 to safely operate at relatively large drain-to-source voltages. In such examples, the correction circuitry 240, 308 may be modified to remove the transistors 380, 390. The output common voltage controls the transistors 380, 390 of FIGS. 3 and 4. The transistors 380, 390 are drain-extended transistors, which allow the transistors 382, 392 to operate in relation to voltages of the digital input signal. In some examples, the transistors 382, 392 are low voltage threshold transistors, which reduces the parasitic capacitance of the output terminals of the self-correcting level shifter circuitry 300, 400. In such example operations, the resistor 384 of FIGS. 3 and 4 generates a first compensation voltage responsive to the digital output signal causing the transistor 378 to conduct current and the digital input signal causing the transistor 382 to conduct current. Such operations occur when the digital input signal is a logical one and the digital output signal is a logical zero. Similarly, the resistor 394 of FIGS. 3 and 4 generates a second compensation voltage responsive to the inverted digital output signal causing the transistor 388 to conduct current and the inverted digital input signal causing the transistor 392 to conduct current. Such operations occur when the digital input signal is a logical zero and the digital output signal is a logical one.

If the correction circuitry 240, 308 determines that the digital output matches the digital input (e.g., Block 550 returns a result of YES), control proceeds to return to block 505. In example operations, the voltage difference across the resistor 384 is approximately zero volts responsive to the digital output signal causing the transistor 378 to be non-conducting or the digital input signal causing the transistor 382 to be non-conducting. Such operations occur when the digital input signal is a logical zero or the digital output signal is a logical one. Similarly, the voltage difference across the resistor 394 is approximately zero responsive to the inverted digital output signal causing the transistor 388 to be non-conducting or the inverted digital input signal causing the transistor 392 to be non-conducting. Such operations occur when the digital input signal is a logical one or the digital output signal is a logical zero.

If the correction circuitry 240, 308 determines that the digital output does not match the digital input (e.g., Block 550 returns a result of NO), control proceeds to example operations 600 of FIG. 6, below, at which the correction circuitry 240, 308 corrects the logical state of the digital output. (Blocks 605-655).

Although example methods are described with reference to the flowchart illustrated in FIG. 5, many other methods of implementing the self-correcting level shifter circuitry 110, 200, 300, 400 of FIGS. 1, 2, 3, and 4 may also be used in this description. For example, the order of execution of the blocks may be changed, or some of the blocks described may be changed, eliminated, or combined. Similarly, additional operations may be included in the manufacturing process before, in between, or after the blocks shown in the illustrated examples.

Figure 6:
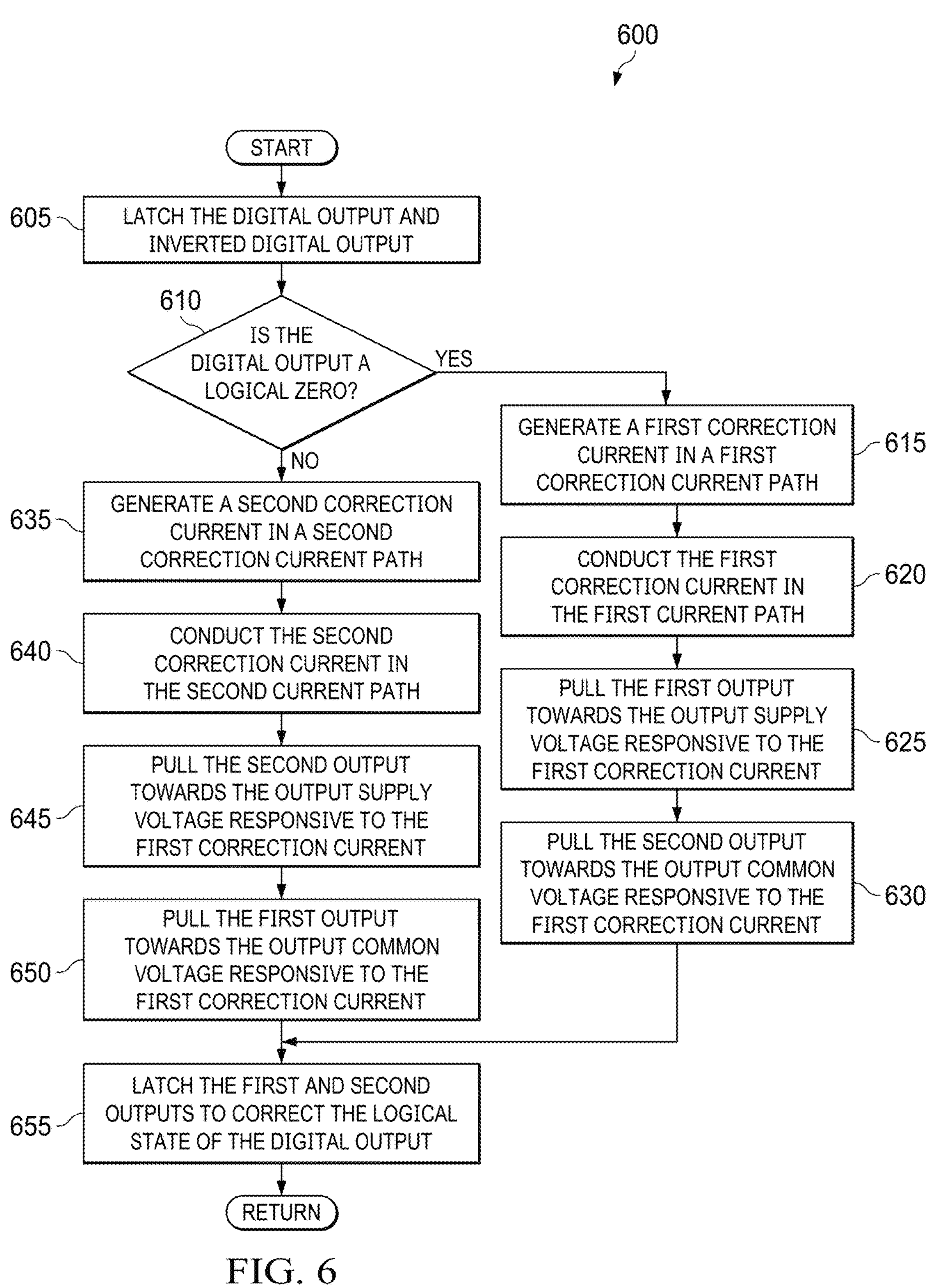
FIG. 6 is a flowchart representative of example operations that may be at least one of executed, instantiated, or performed using an example implementation of the self-correcting level shifter circuitry of FIGS. 1, 2, 3, and 4 to correct a logical state of an output.

FIG. 6 is a flowchart representative of example operations 600 that may be at least one of executed, instantiated, or performed using an example implementation of the self-correcting level shifter circuitry 110, 200, 300, 400 of FIGS. 1, 2, 3, and 4 to correct a logical state of an output. The example operations 600 of FIG. 6 begin at Block 605, at which the latch circuitry 230, 306 of FIGS. 2, 3, and 4 latches the digital output and inverted digital output. (Block 605). In example operation, the digital output signal controls the transistors 366, 368 of FIGS. 3 and 4 and the inverted digital output signal controls the transistors 370, 372. When the digital output signal is a logical one, the transistor 368 pulls the second output of level shifter circuitry 210, 302, 405 of FIGS. 2, 3, and 4 towards the output common voltage and the transistor 370 pulls the first output of the level shifter circuitry 210, 302, 405 towards the output supply voltage. When the digital output signal is a logical zero, the transistor 366 pulls the second output of level shifter circuitry 210, 302, 405 of FIGS. 2, 3, and 4 towards the output supply voltage and the transistor 372 pulls the first output of the level shifter circuitry 210, 302, 405 towards the output common voltage. Advantageously, the latch circuitry 230, 306 increases the noise immunity of the digital output signal after the latch circuitry 220, 304 set the logical state.

The correction circuitry 240, 308 determines if the digital output is a logical zero. (Block 610). In example operations, the digital output signal controls the transistor 378 of FIGS. 3 and 4 and the inverted digital output signal controls the transistor 388 of FIGS. 3 and 4. Also, the digital input signal controls the transistor 382 of FIGS. 3 and 4 and the inverted digital input signal controls the transistor 392 of FIGS. 3 and 4. In some examples, the transistors 378, 388 are drain-extended transistors, which allow the transistors 378, 388 to safely operate at relatively large drain-to-source voltages. In such examples, the correction circuitry 240, 308 may be modified to remove the transistors 380, 390. The output common voltage controls the transistors 380, 390 of FIGS. 3 and 4. The transistors 380, 390 are drain-extended transistors, which allow the transistors 382, 392 to operate in relation to voltages of the digital input signal. In some examples, the transistors 382, 392 are low voltage threshold transistors, which reduces the parasitic capacitance of the output terminals of the self-correcting level shifter circuitry 300, 400. In such example operations, the resistor 384 of FIGS. 3 and 4 generates a first compensation voltage responsive to the digital output signal being a logical zero and the digital input signal being a logical one. Similarly, the resistor 394 of FIGS. 3 and 4 generates a second compensation voltage responsive to the inverted digital output signal being a logical zero and the inverted digital input signal being a logical one. Advantageously, the transistors 378, 382 generate the first compensation voltage when the digital output signal is a logical zero and the digital input signal is a logical one. Advantageously, the transistors 388, 392 generate the second compensation voltage when the digital output signal is a logical one and the digital input signal is a logical zero.

When the digital output is a logical zero (e.g. Block 610 returns a result of YES), the correction circuitry 240, 308 generates a first correction current in a first correction current path. (Block 615). In some examples, the transistors 378, 382 supply current to the resistor 384, which generates a first compensation voltage, responsive to the digital input signal being a logical one and the digital output signal being a logical zero. In such examples, the first compensation voltage of the resistor 384 controls the transistor 395 of FIGS. 3 and 4. The transistor 395 conducts a first compensation current responsive to the first compensation voltage.

The correction circuitry 240, 308 conducts the first correction current in the first current path. (Block 620). In some examples, the transistor 395 conducts the first correction current from the transistors 314, 330 of FIG. 3. In such examples, the transistors 332, 336 of FIG. 3 mirror the first correction current through the transistor 330. Similarly, the transistor 395 conducts the first correction current from the transistors 410, 425 of FIG. 4. The transistors 430, 440 of FIG. 4 mirror the first correction current through the transistor 425.

The level shifter circuitry 210, 302, 405 pulls the first output towards the output supply voltage responsive to the first correction current. (Block 625). In example operations, the transistors 338, 340, 342, 346, 348 of FIG. 3 are non-conducting responsive to the lack of current conduction by the transistors 328, 326. In such example operations, the transistor 336 uses the first correction current to pull the input of the amplifier circuitry 354 of FIGS. 3 and 4 towards the output supply voltage. Similarly, the transistors 445, 450, 455, 465, 470 of FIG. 4 are non-conducting responsive to the lack of current conduction by the transistor 420. In such example operations, the transistor 440 uses the first correction current to pull the input of the amplifier circuitry 354 towards the output supply voltage.

The level shifter circuitry 210, 302, 405 pulls the second output towards the output common voltage responsive to the first correction current. (Block 630). In example operations, the transistors 346, 348 are non-conducting responsive to the lack of current conduction by the transistors 328, 326. In such example operations, the transistor 344 of FIG. 3 mirrors the first correction current through the transistors 332, 334 of FIG. 3, which pulls the input of the amplifier circuitry 350 of FIGS. 3 and 4 towards the output common voltage. Similarly, the transistors 465, 470 are non-conducting responsive to the lack of current conduction by the transistor 420. In such example operations, the transistor 460 of FIG. 4 mirrors the first correction current through the transistors 430, 435 of FIG. 4, which pulls the input of the amplifier circuitry 350 towards the output common voltage.

When the digital output is not a logical zero (e.g. Block 610 returns a result of NO), the correction circuitry 240, 308 generates a second correction current in a second correction current path. (Block 635). In some examples, the transistors 388, 392 supply current to the resistor 394, which generates a second compensation voltage, responsive to the digital input signal being a logical zero and the digital output signal being a logical one. In such examples, the second compensation voltage of the resistor 394 controls the transistor 397 of FIGS. 3 and 4. The transistor 397 conducts a second compensation current responsive to the second compensation voltage.

The correction circuitry 240, 308 conducts the second correction current in the second current path. (Block 640). In some examples, the transistor 397 conducts the second correction current from the transistors 328, 348 of FIG. 3. In such examples, the transistors 342, 346 of FIG. 3 mirror the second correction current through the transistor 348. Similarly, the transistor 397 conducts the second correction current from the transistors 420, 470 of FIG. 4. The transistors 455, 465 of FIG. 4 mirror the second correction current through the transistor 470.

The level shifter circuitry 210, 302, 405 pulls the second output towards the output supply voltage responsive to the second correction current. (Block 645). In example operations, the transistors 330, 332, 334, 336, 344 are non-conducting responsive to the lack of current conduction by the transistors 314, 316. In such example operations, the transistor 346 uses the second correction current to pull the input of the amplifier circuitry 350 towards the output supply voltage. Similarly, the transistors 425, 430, 440, 435, 460 are non-conducting responsive to the lack of current conduction by the transistor 410. In such example operations, the transistor 465 uses the second correction current to pull the input of the amplifier circuitry 350 towards the output supply voltage.

The level shifter circuitry 210, 302, 405 pulls the first output towards the output common voltage responsive to the second correction current. (Block 650). In example operations, the transistors 330, 336 are non-conducting responsive to the lack of current conduction by the transistors 314, 316. In such example operations, the transistor 338 mirrors the second correction current through the transistors 340, 342, which pulls the input of the amplifier circuitry 354 towards the output common voltage. Similarly, the transistors 425, 440 are non-conducting responsive to the lack of current conduction by the transistor 410. In such example operations, the transistor 445 mirrors the second correction current through the transistors 450, 455, which pulls the input of the amplifier circuitry 354 towards the output common voltage.

The latch circuitry 220, 304 latch the first and second outputs to correct the logical state of the digital output. (Block 655). In example operations, the amplifier circuitry 350, 354 receive the corrected first and second outputs from the level shifter circuitry 210, 302, 405. In some examples, the amplifier circuitry 350, 354 are Schmitt triggers, which generate a logical one or logical zero based on a comparison of an input voltage to a supply voltage. In other examples, the latch circuitry 220, 304 may be modified to remove or replace the amplifier circuitry 350, 354 with alternative circuitry to convert an analog input voltage to a digital output using a comparison. The logic devices 352, 356 of FIGS. 3 and 4 latch the corrected outputs of the amplifier circuitry 350, 354. The inverters 358, 360 of FIGS. 3 and 4 generate the digital output signal and the inverted digital output signal by inverting a corrected output of the logic device 356. Control proceeds to return to Block 505 of FIG. 5.

Although example methods are described with reference to the flowchart illustrated in FIG. 6, many other methods of implementing the self-correcting level shifter circuitry 110, 200, 300, 400 of FIGS. 1, 2, 3, and 4 may also be used in this description. For example, the order of execution of the blocks may be changed, or some of the blocks described may be changed, eliminated, or combined. Similarly, additional operations may be included in the manufacturing process before, in between, or after the blocks shown in the illustrated examples.

Figure 7:
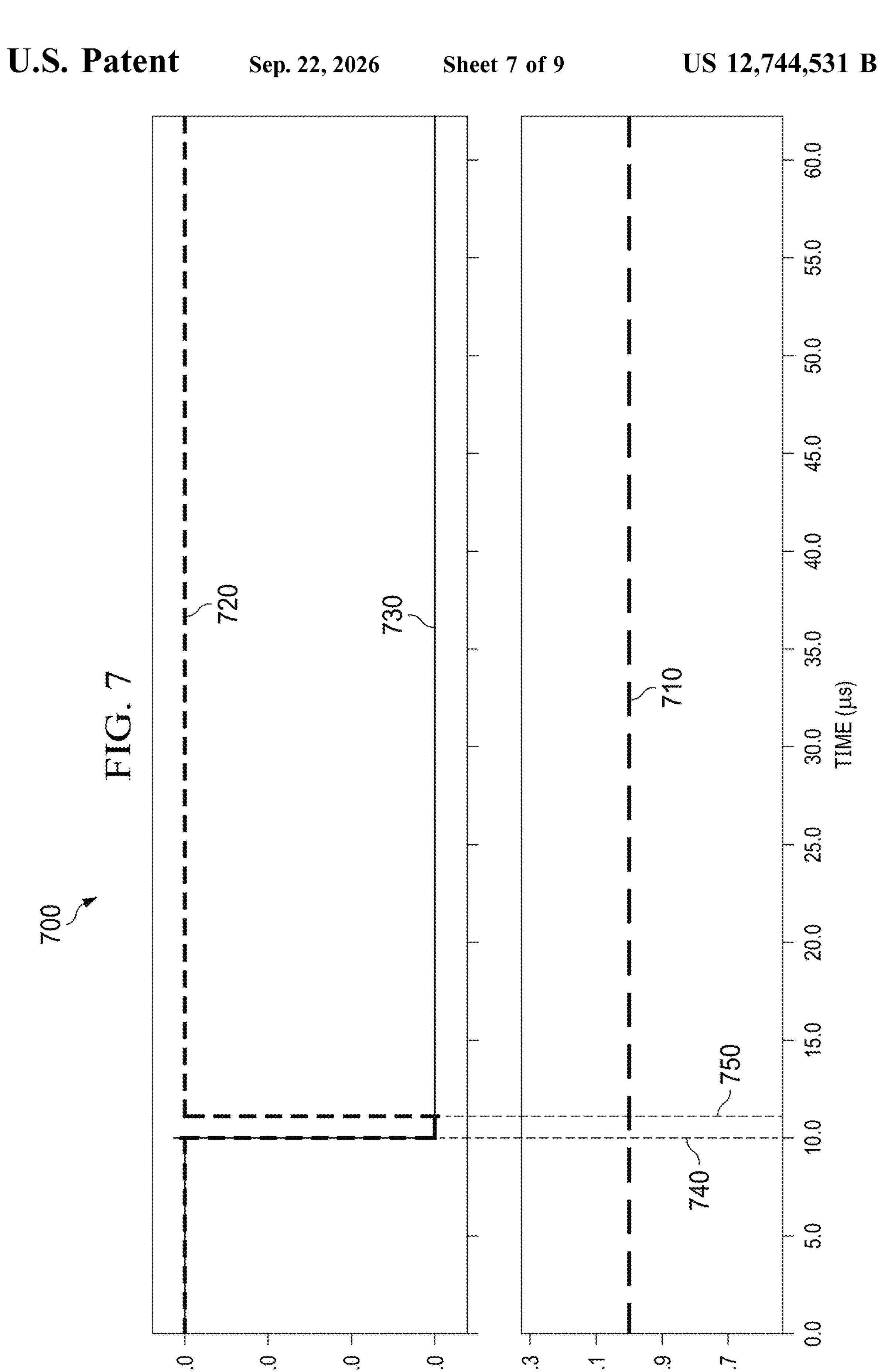
FIG. 7 is a waveform plot of an example a logic high correction of the level shifter circuitry of FIGS. 1, 2, 3, and 4.

FIG. 7 is a waveform plot 700 of an example a logic high correction of the self-correcting level shifter circuitry 110, 200, 300, 400 of FIGS. 1, 2, 3, and 4. In the example of FIG. 7, the waveform plot 700 includes a digital input signal 710, a self-correcting digital output signal 720, and a non-correcting digital output signal 730. The digital input signal 710 illustrates a signal at the input terminal of the self-correcting level shifter circuitry 110, 200, 300, 400. The self-correcting digital output signal 720 illustrates an example of the digital output of the self-correcting level shifter circuitry 110, 200, 300, 400. The non-correcting digital output signal 730 illustrates an output of level shifter circuitry without the correction circuitry 240, 308 of FIGS. 2, 3, and 4.

In the example of FIG. 7, the input supply voltage is approximately four volts and the input common voltage is approximately zero volts. Also, the output supply voltage is approximately fifteen volts and the output common voltage is approximately twelve volts. The digital input signal 710 represents a logical one when equal to four volts and a logical zero when equal to zero volts. The digital output signals 720, 730 represent a logical one when equal to fifteen volts and a logical zero when equal to twelve volts. At a first time 740, the digital output signals 720, 730 transition from a logical one to a logical zero and the digital input signal 710 remains a logical one. Such operations may occur responsive to adverse operating conditions, such as voltage ripples on the output supply voltage or the output common voltage. In the example of FIG. 7, the transition of the digital output signals 720, 730 is an illustrative representation of some such operations. Between the first time 740 and a second time 750, the correction circuitry 240, 308 generates the first correction current (e.g., Block 615 of FIG. 6). The level shifter circuitry 210, 302, 405 of FIGS. 2, 3, and 4 uses the first correction current to correct the self-correcting digital output signal 720 at the second time 750. Advantageously, the correction circuitry 240, 308 corrects the digital output of the self-correcting level shifter circuitry 110, 200, 300, 400.

Figure 8:
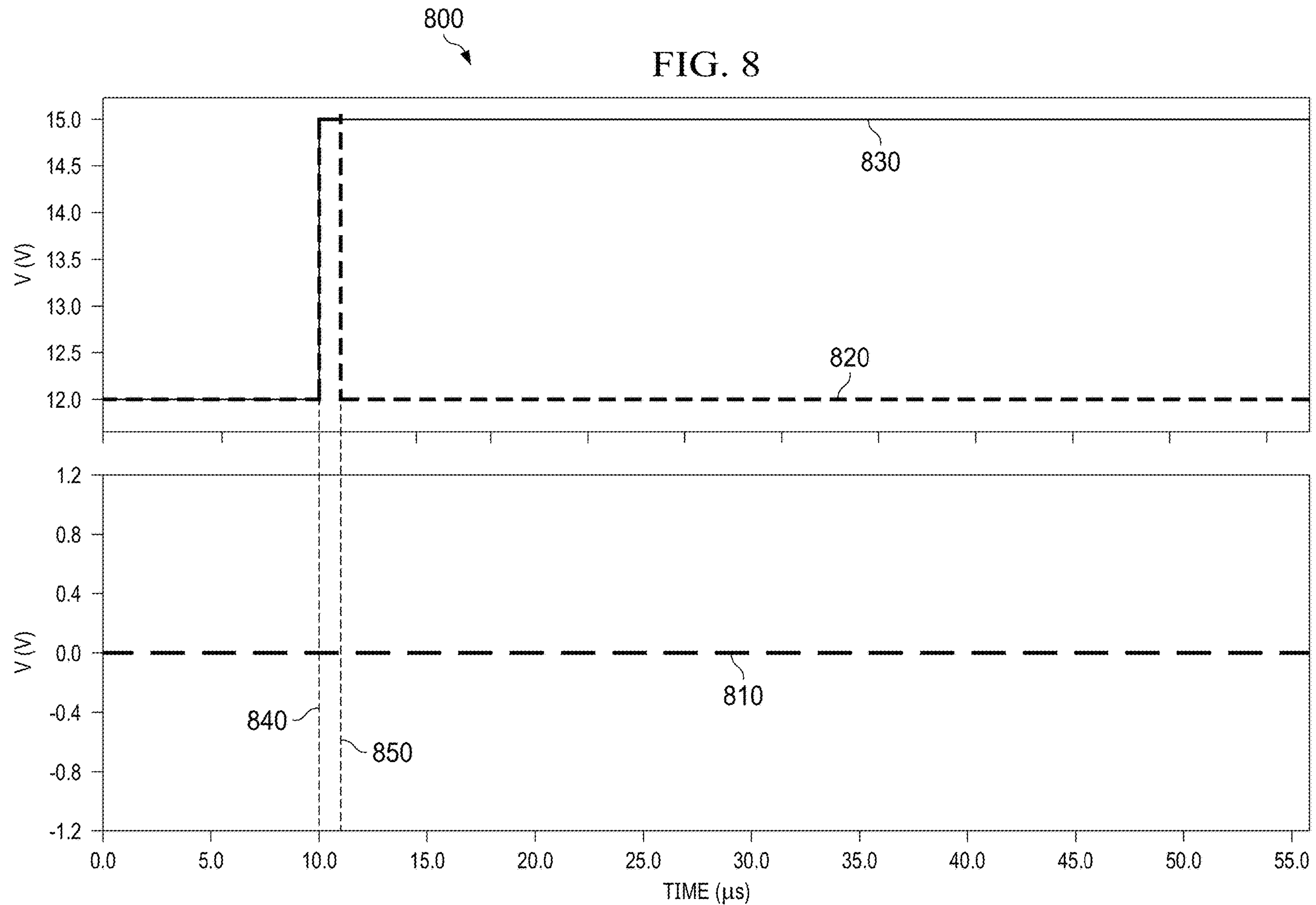
FIG. 8 is a timing diagram of an example of a logic low correction of the level shifter circuitry of FIGS. 1, 2, 3, and 4.

FIG. 8 is a timing diagram 800 of an example a logic low correction of the self-correcting level shifter circuitry 110, 200, 300, 400 of FIGS. 1, 2, 3, and 4. In the example of FIG. 8, the timing diagram 800 includes a digital input signal 810, a self-correcting digital output signal 820, and a non-self-correcting digital output signal 830. The digital input signal 810 illustrates a signal at the input terminal of the self-correcting level shifter circuitry 110, 200, 300, 400. The self-correcting digital output signal 820 illustrates an example of the digital output of the self-correcting level shifter circuitry 110, 200, 300, 400. The non-correcting digital output signal 830 illustrates an output of level shifter circuitry without the correction circuitry 240, 308 of FIGS. 2, 3, and 4.

In the example of FIG. 8, the input supply voltage is approximately four volts and the input common voltage is approximately zero volts. Also, the output supply voltage is approximately fifteen volts and the output common voltage is approximately twelve volts. The digital input signal 810 represents a logical one when equal to four volts and a logical zero when equal to zero volts. The digital output signals 820, 830 represent a logical one when equal to fifteen volts and a logical zero when equal to twelve volts. At a first time 840, the digital output signals 820, 830 transition from a logical zero to a logical one and the digital input signal 810 remains a logic zero. Such operations may occur responsive to adverse operating conditions, such as voltage ripples on the output supply voltage or the output common voltage. Between the first time 840 and a second time 850, the correction circuitry 240, 308 generates the second correction current (e.g., Block 635 of FIG. 6). The level shifter circuitry 210, 302, 405 of FIGS. 2, 3, and 4 uses the second correction current to correct the self-correcting digital output signal 820 at the second time 850. Advantageously, the correction circuitry 240, 308 corrects the digital output of the self-correcting level shifter circuitry 110, 200, 300, 400.

Figure 9:
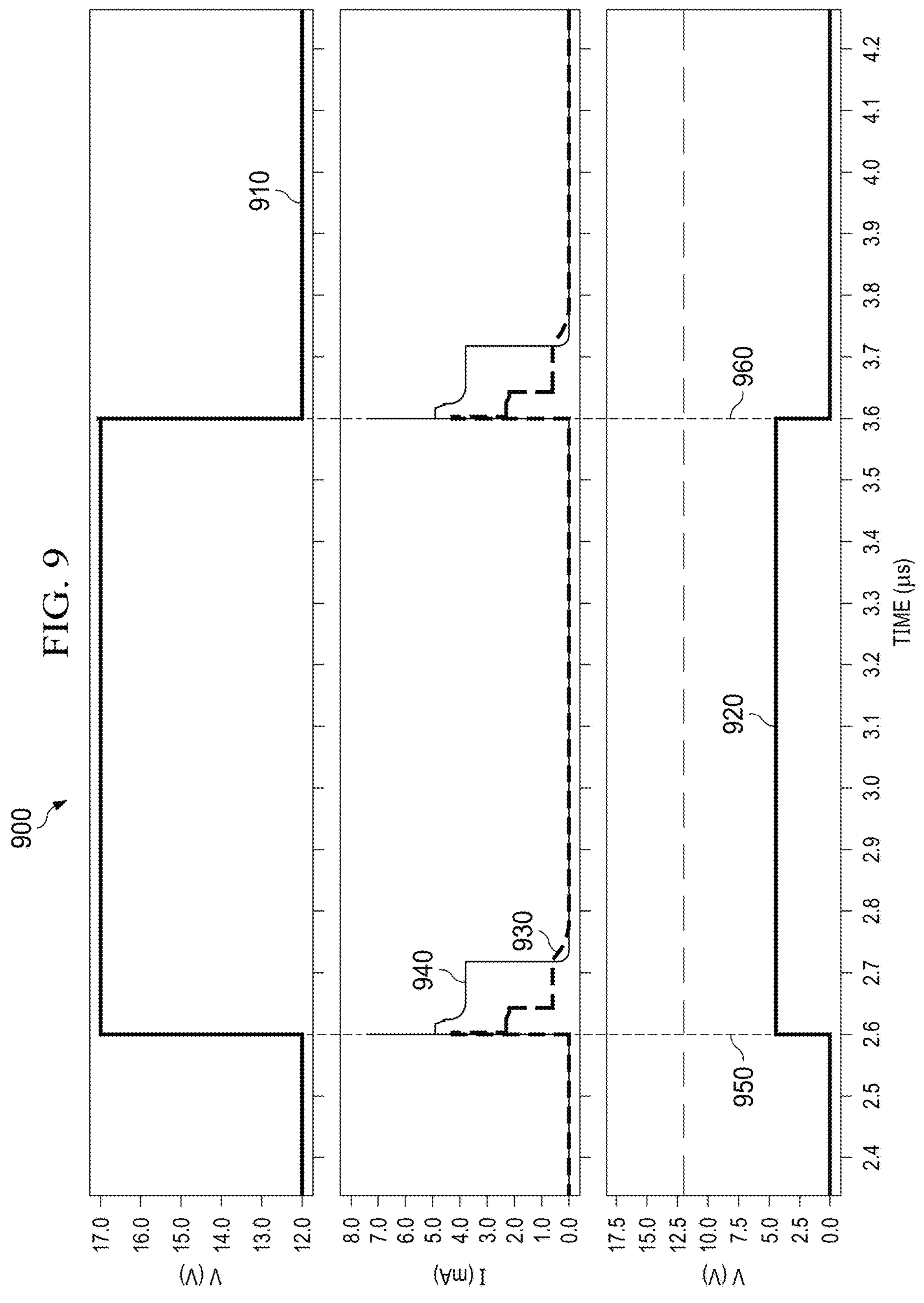
FIG. 9 is a timing diagram of an example quiescent current of the level shifter circuitry of FIGS. 1, 2, 3, and 4.

FIG. 9 is a timing diagram 900 of an example quiescent current of the self-correcting level shifter circuitry 110, 200, 300, 400 of FIGS. 1, 2, 3, and 4. In the example of FIG. 9, the timing diagram 900 includes a digital output signal 910, a digital input signal 920, a correction quiescent current 930, and a non-correction quiescent current 940. The digital output signal 910 illustrates a signal at the output terminal of the self-correcting level shifter circuitry 110, 200, 300, 400. The digital input signal 920 illustrates a signal at the input terminal of the self-correcting level shifter circuitry 110, 200, 300, 400. The correction quiescent current 930 illustrates an example quiescent current of the self-correcting level shifter circuitry 110, 200, 300, 400. The non-correction quiescent current 940 illustrates an example quiescent current of level shifter circuitry without the correction circuitry 240, 308 of FIGS. 2, 3, and 4.

In the example of FIG. 9, the input supply voltage is approximately four volts and the input common voltage is approximately zero volts. Also, the output supply voltage is approximately fifteen volts and the output common voltage is approximately twelve volts. The digital output signal 910 represents a logical one when equal to fifteen volts and a logical zero when equal to twelve volts. The digital input signal 920 represents a logical one when equal to four volts and a logical zero when equal to zero volts.

At a first time 950, the digital input signal 920 and the digital output signal 910 transition from a logical zero to a logical one. At the first time 950, the correction quiescent current 930 increases to approximately four milliamps and the non-correction quiescent current 940 increases to approximately seven milliamps. After the first time 950, the correction quiescent current 930 remains less than the non-correction quiescent current 940. At a second time 960, the digital input signal 920 and the digital output signal 910 transition from a logical one to a logical zero. At the second time 960, the correction quiescent current 930 increases to approximately four milliamps and the non-correction quiescent current 940 increases to approximately seven milliamps. In example operations, without the correction circuitry 240, 308, level shifting circuitry needs to have the non-correction quiescent current 940 be large enough to set the digital output during worst case operating conditions (e.g., lowest supply voltage, worst case process variations, highest temperature, etc.). However, and advantageously, if the correction quiescent current 930 is not large enough to set the digital output, the correction current from the correction circuitry 240, 308 corrects the digital output even after a pulse from the delay circuitry 310, 320. Advantageously, the correction circuitry 240, 308 allows the correction quiescent current 930 to be a current less than a current that accounts for worst case operating conditions. After the second time 960, the correction quiescent current 930 remains less than the non-correction quiescent current 940.

Advantageously, the self-correcting level shifter circuitry 110, 200, 300, 400 has a smaller quiescent current, which increases power efficiency.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, additional elements, terms, etc., may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, or (7) A with B and with C. As used herein in the context of describing structures, components, items, objects and things, the phrase "at least one of A and B" refers to implementations including any of (1) at least one A, (2) at least one B, or (3) at least one A and at least one B. Similarly, as used herein in the context of describing structures, components, items, objects and things, the phrase "at least one of A or B" refers to implementations including any of (1) at least one A, (2) at least one B, or (3) at least one A and at least one B. As used herein in the context of describing the performance or execution of processes, instructions, actions, activities, etc., the phrase "at least one of A and B" refers to implementations including any of (1) at least one A, (2) at least one B, or (3) at least one A and at least one B. Similarly, as used herein in the context of describing the performance or execution of processes, instructions, actions, activities, etc., the phrase "at least one of A or B" refers to implementations including any of (1) at least one A, (2) at least one B, or (3) at least one A and at least one B.

As used herein, singular references (e.g., "a," "an," "first," "second," etc.) do not exclude a plurality. The term "a" or "an" object, as used herein, refers to one or more of that object. The terms "a" (or "an"), "one or more," and "at least one" are used interchangeably herein. Furthermore, although individually listed, a plurality of means, elements, or actions may be implemented by, e.g., the same entity or object. Also, although individual features may be included in different examples or claims, these may possibly be combined, and the inclusion in different examples or claims does not imply that a combination of features is at least one of not feasible or advantageous.

As used herein, unless otherwise stated, the term "above" describes the relationship of two parts relative to Earth. A first part is above a second part, if the second part has at least one part between Earth and the first part. Likewise, as used herein, a first part is "below" a second part when the first part is closer to the Earth than the second part. As noted above, a first part can be above or below a second part with one or more of: other parts therebetween, without other parts therebetween, with the first and second parts touching, or without the first and second parts being in direct contact with one another.

As used in this patent, stating that any part (e.g., a layer, film, area, region, or plate) is in any way on (e.g., positioned on, located on, disposed on, or formed on, etc.) another part, indicates that the referenced part is either in contact with the other part, or that the referenced part is above the other part with one or more intermediate part(s) located therebetween.

As used herein, connection references (e.g., attached, coupled, connected, and joined) may include intermediate members between the elements referenced by at least one of the connection reference or relative movement between those elements unless otherwise indicated. As such, connection references do not necessarily infer that two elements are directly connected or in fixed relation to each other. As used herein, stating that any part is in "contact" with another part is defined to mean that there is no intermediate part between the two parts.

Unless specifically stated otherwise, descriptors such as "first," "second," "third," etc., are used herein without imputing or otherwise indicating any meaning of priority, physical order, arrangement in a list, or ordering in any way, but are merely used as at least one of labels or arbitrary names to distinguish elements for case of understanding the described examples. In some examples, the descriptor "first" may be used to refer to an element in the detailed description, while the same element may be referred to in a claim with a different descriptor such as "second" or "third." In such instances, such descriptors are used merely for identifying those elements distinctly within the context of the discussion (e.g., within a claim) in which the elements might, for example, otherwise share a same name.

As used herein, "approximately" and "about" modify their subjects/values to recognize the potential presence of variations that occur in real world applications. For example, "approximately" and "about" may modify dimensions that may not be exact due to at least one of manufacturing tolerances or other real-world imperfections. For example, "approximately" and "about" may indicate such dimensions may be within a tolerance range of ±10% unless otherwise specified herein.

As used herein, the phrase "in communication," including variations thereof, encompasses one of or a combination of direct communication or indirect communication through one or more intermediary components, and does not require direct physical (e.g., wired) communication or constant communication, but rather also includes selective communication at least one of periodic intervals, scheduled intervals, aperiodic intervals, or one-time events.

As used herein, "programmable circuitry" is defined to include at least one of (i) one or more special purpose electrical circuits (e.g., an application specific circuit (ASIC)) structured to perform specific operation(s) and including one or more semiconductor-based logic devices (e.g., electrical hardware implemented by one or more transistors), or (ii) one or more general purpose semiconductor-based electrical circuits programmable with instructions to perform one or more specific functions(s) or operation(s) and including one or more semiconductor-based logic devices (e.g., electrical hardware implemented by one or more transistors). Examples of programmable circuitry include programmable microprocessors such as Central Processor Units (CPUs) that may execute first instructions to perform one or more operations or functions, Field Programmable Gate Arrays (FPGAs) that may be programmed with second instructions to at least one of configure or structure the FPGAs to instantiate one or more operations or functions corresponding to the first instructions, Graphics Processor Units (GPUs) that may execute first instructions to perform one or more operations or functions, Digital Signal Processors (DSPs) that may execute first instructions to perform one or more operations or functions, XPUs, Network Processing Units (NPUs) one or more microcontrollers that may execute first instructions to perform one or more operations or functions or integrated circuits such as Application Specific Integrated Circuits (ASICs). For example, an XPU may be implemented by a heterogeneous computing system including multiple types of programmable circuitry (e.g., one or more FPGAs, one or more CPUs, one or more GPUs, one or more NPUs, one or more DSPs, etc., and any combination(s) thereof), and orchestration technology (e.g., application programming interface(s) (API(s)) that may assign computing task(s) to whichever one(s) of the multiple types of programmable circuitry is/are suited and available to perform the computing task(s).

As used herein integrated circuit/circuitry is defined as one or more semiconductor packages containing one or more circuit elements such as transistors, capacitors, inductors, resistors, current paths, diodes, etc. For example, an integrated circuit may be implemented as one or more of an ASIC, an FPGA, a chip, a microchip, programmable circuitry, a semiconductor substrate coupling multiple circuit elements, a system on chip (SoC), etc.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., at least one of programmed or hardwired) at a time of manufacturing by a manufacturer to at least one of perform the function or be configurable (or re-configurable) by a user after manufacturing to perform the function/or other additional or alternative functions. The configuring may be through at least one of firmware or software programming of the device, through at least one of a construction or layout of hardware components and interconnections of the device, or a combination thereof.

As used herein, the terms "terminal," "node," "interconnection," "pin" and "lead" are used interchangeably. Unless specifically stated to the contrary, these terms are generally used to mean an interconnection between or a terminus of a device element, a circuit element, an integrated circuit, a device or other electronics or semiconductor component.

In the description and claims, described "circuitry" may include one or more circuits. A circuit or device that is described herein as including certain components may instead be adapted to be coupled to those components to form the described circuitry or device. For example, a structure described as including one or more semiconductor elements (such as transistors), one or more passive elements (such as one of or a combination of resistors, capacitors, or inductors), or one or more sources (such as voltage and/or current sources) may instead include only the semiconductor elements within a single physical device (e.g., at least one of a semiconductor die or integrated circuit (IC) package) and may be adapted to be coupled to at least some of the passive elements or the sources to form the described structure either at a time of manufacture or after a time of manufacture, for example, by at least one of an end-user or a third-party.

Circuits described herein are reconfigurable to include the replaced components to provide functionality at least partially similar to functionality available prior to the component replacement. Components shown as resistors, unless otherwise stated, are generally representative of any one or more elements coupled in at least one of series or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor. While certain elements of the described examples are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and some features illustrated as being internal to the integrated circuit may be incorporated outside of the integrated. As used herein, the term "integrated circuit" means one or more circuits that are at least one of: (i) incorporated in/over a semiconductor substrate; (ii) incorporated in a single semiconductor package; (iii) incorporated into the same module; or (iv) incorporated in/on the same printed circuit board.

Uses of the phrase "ground" in the foregoing description include at least one of a chassis ground, an Earth ground, a floating ground, a virtual ground, a digital ground, a common ground, or any other form of ground connection applicable to, or suitable for, the teachings of this description. Unless otherwise stated, "about," "approximately," or "substantially" preceding a value means±10 percent of the stated value, or, if the value is zero, a reasonable range of values around zero.

Modifications are possible in the described embodiments, and other embodiments are possible, within the scope of the claims.

What is claimed is:

1. An apparatus comprising:

level shifter circuitry having an input terminal and an output terminal;

latch circuitry having an input terminal and an output terminal, the input terminal of the latch circuitry coupled to the output terminal of the level shifter circuitry;

a first transistor having a first terminal and a control terminal, the first terminal of the first transistor coupled to the level shifter circuitry;

a second transistor having a first terminal, a second terminal, and a control terminal, the first terminal of the second transistor coupled to the control terminal of the first transistor, the control terminal of the second transistor coupled to the input terminal of the level shifter circuitry; and a third transistor having a first terminal and a control terminal, the first terminal of the third transistor coupled to the second terminal of the second transistor, the control terminal of the third transistor coupled to the output terminal of the latch circuitry.

2. The apparatus of claim 1, wherein the latch circuitry is first latch circuitry, the apparatus further comprising second latch circuitry having a first terminal and a second terminal, the first terminal of the second latch circuitry is coupled to the output terminal of the first latch circuitry, and the second terminal of the second latch circuitry is coupled to the output terminal of the level shifter circuitry.

3. The apparatus of claim 1, wherein the level shifter circuitry includes:

a fourth transistor having a first terminal, a second terminal, and a control terminal, the first terminal of the fourth transistor is coupled to the first terminal of the first transistor, the control terminal of the fourth transistor is coupled to the control terminal of the second transistor;

a fifth transistor having a first terminal and a control terminal;

a sixth transistor having a first terminal and a control terminal, the control terminal of the sixth transistor is coupled to the second terminal of the fourth transistor, the first terminal of the fifth transistor, and the control terminal of the fifth transistor;

a seventh transistor having a first terminal and a control terminal; and an eighth transistor having a first terminal and a control terminal, the first terminal of the eighth transistor is coupled to the input terminal of the latch circuitry, the control terminal of the eighth transistor is coupled to the first terminal of the sixth transistor, the first terminal of the seventh transistor, and the control terminal of the seventh transistor.

4. The apparatus of claim 1, wherein the first transistor further has a second terminal, the apparatus further comprising:

a first resistor having a terminal coupled to the second terminal of the first transistor; and a second resistor having a terminal coupled to the control terminal of the first transistor and the first terminal of the second transistor.

5. The apparatus of claim 1, further comprising:

a common terminal; and a fourth transistor having a first terminal, a second terminal, and a control terminal, the first terminal of the fourth transistor is coupled to the second terminal of the second transistor, the second terminal of the fourth transistor is coupled to the first terminal of the third transistor, and the control terminal of the fourth transistor is coupled to the common terminal.

6. The apparatus of claim 1, wherein the input terminal of the level shifter circuitry is a first input terminal, the level shifter circuitry further has a second input terminal coupled to a second terminal of the first transistor, the output terminal of the latch circuitry is a first output terminal, the latch circuitry further has a second output terminal, and the apparatus further comprising:

an inverter having a first terminal and a second terminal, the first terminal of the inverter is coupled to the first input terminal of the level shifter circuitry and the control terminal of the second transistor;

a fourth transistor having first and second terminals and a control terminal, the first terminal of the fourth transistor is coupled to the second input terminal of the level shifter circuitry the second terminal of the fourth transistor is coupled to the level shifter circuitry;

a fifth transistor having a first terminal, a second terminal, and a control terminal, the first terminal of the fifth transistor is coupled to the control terminal of the fourth transistor, the control terminal of the fifth transistor is coupled to the second terminal of the inverter; and a sixth transistor having a first terminal and a control terminal, the first terminal of the sixth transistor is coupled to the second terminal of the fifth transistor, and the control terminal of the sixth transistor is coupled to the second output terminal of the latch circuitry.

7. The apparatus of claim 6, further comprising:

a first resistor coupled between the first terminal of the fourth transistor and the second input terminal of the level shifter circuitry;

a second resistor having a terminal coupled to the control terminal of the fourth transistor and the first terminal of the fifth transistor; and a seventh transistor having a first terminal and a second terminal, the first terminal of the seventh transistor is coupled to the second terminal of the fifth transistor, the second terminal of the seventh transistor is coupled to the first terminal of the sixth transistor.

8. The apparatus of claim 1, further comprising:

a first supply terminal coupled to the level shifter circuitry;

a first common terminal coupled to the second transistor;

a second supply terminal coupled to the level shifter circuitry and the third transistor;

a second common terminal coupled to the level shifter circuitry;

delay circuitry coupled to the input terminal of the level shifter circuitry, the first supply terminal, and the first common terminal; and driver circuitry coupled to the output terminal of the latch circuitry, the control terminal of the third transistor, the second supply terminal, and the second common terminal.

9. An apparatus comprising:

level shifter circuitry having a first terminal, a second terminal, and a third terminal;

current source circuitry having a first terminal and a control terminal, the first terminal of the current source circuitry coupled to the first terminal of the level shifter circuitry;

a first transistor having a first terminal, a second terminal, and a control terminal, the first terminal of the first transistor coupled to the control terminal of the current source circuitry, the control terminal of the first transistor coupled to the second terminal of the level shifter circuitry;

a second transistor having a first terminal and a second terminal, the first terminal of the second transistor coupled to the second terminal of the first transistor; and a third transistor having a first terminal and a control terminal, the first terminal of the third transistor coupled to the second terminal of the second transistor, the control terminal of the third transistor coupled to the third terminal of the level shifter circuitry.

10. The apparatus of claim 9, further comprising latch circuitry having a first terminal and a second terminal, the first terminal of the latch circuitry is coupled to the third terminal of the level shifter circuitry, the second terminal of the latch circuitry is coupled to the control terminal of the third transistor.

11. The apparatus of claim 9, wherein the level shifter circuitry includes:

a fourth transistor having a first terminal, a second terminal, and a control terminal, the first terminal of the fourth transistor is coupled to the first terminal of the current source circuitry, the control terminal of the fourth transistor is coupled to the control terminal of the first transistor;

a fifth transistor having a first terminal and a control terminal;

a sixth transistor having a first terminal and a control terminal, the control terminal of the sixth transistor is coupled to the second terminal of the fourth transistor, the first terminal of the fifth transistor, and the control terminal of the fifth transistor;

a seventh transistor having a first terminal and a control terminal; and an eighth transistor having a first terminal and a control terminal, the first terminal of the eighth transistor is coupled to the control terminal of the third transistor, the control terminal of the eighth transistor is coupled to the first terminal of the sixth transistor, the first terminal of the seventh transistor, and the control terminal of the seventh transistor.

12. The apparatus of claim 9, wherein the current source circuitry includes:

a resistor having a terminal; and a fourth transistor having a first terminal, a second terminal, and a control terminal, the first terminal of the fourth transistor is coupled to the first terminal of the level shifter circuitry, the second terminal of the fourth transistor is coupled to the terminal of the resistor, the control terminal of the fourth transistor is coupled to the first terminal of the first transistor.

13. The apparatus of claim 9, wherein the level shifter circuitry further having a fourth terminal and a fifth terminal, the current source circuitry is first current source circuitry, and the apparatus further comprising:

second current source circuitry having a first terminal and a control terminal, the first terminal of the second current source circuitry is coupled to the fourth terminal of the level shifter circuitry;

an inverter having a first terminal and a second terminal, the first terminal of the inverter is coupled to second terminal of the level shifter circuitry and the control terminal of the first transistor;

a fourth transistor having a first terminal, a second terminal, and a control terminal, the first terminal of the fourth transistor is coupled to the first terminal of the second current source circuitry, the control terminal of the fourth transistor is coupled to the second terminal of the inverter;

a fifth transistor having a first terminal and a second terminal, the first terminal of the fifth transistor is coupled to the second terminal of the fourth transistor; and a sixth transistor having a first terminal and a control terminal, the first terminal of the sixth transistor is coupled to the second terminal of the fifth transistor, the control terminal of the sixth transistor is coupled to the fifth terminal of the level shifter circuitry.

14. The apparatus of claim 13, further comprising:

a first resistor having a terminal coupled to the control terminal of the first current source circuitry and the first terminal of the first transistor; and a second resistor having a terminal coupled to the control terminal of the second current source circuitry and the first terminal of the fourth transistor.

15. The apparatus of claim 9, wherein the level shifter circuitry further has a fourth terminal, a fifth terminal, a sixth terminal, and a seventh terminal, the second transistor further has a control terminal, and the apparatus further comprising:

a first supply terminal coupled to fourth terminal of the level shifter circuitry;

a first common terminal coupled to fifth terminal of the level shifter circuitry;

a second supply terminal coupled to the sixth terminal of the level shifter circuitry;

a second common terminal coupled to the seventh terminal of the level shifter circuitry and the control terminal of the second transistor; and a fourth transistor having a control terminal coupled to the third terminal of the level shifter circuitry and the control terminal of the third transistor.

16. An apparatus comprising:

correction circuitry configured to:

compare a digital input from a first circuit to a digital output of a second circuit; and generate a current based on the comparison; and level shifter circuitry coupled to the correction circuitry, the level shifter circuitry configured to:

receive the digital input from the first circuit; and generate the digital output in the second circuit based on a logical state of the digital input; and adjust the logical state of the digital output responsive to the current from the correction circuitry.

17. The apparatus of claim 16, wherein the current is a first current, the correction circuitry further configured to:

generate the first current responsive to a determination that the digital output is a first logical state and the digital input is a second logical state; and generate a second current responsive to a determination that the digital output is the second logical state and the digital input is the first logical state.

18. The apparatus of claim 17, wherein the level shifter circuitry is further configured to:

adjust the digital output from the first logical state to the second logical state responsive to the first current; and adjust the digital output from the second logical state to the first logical state responsive to the second current.

19. The apparatus of claim 16, further comprising latch circuitry coupled to the correction circuitry and the level shifter circuitry, the latch circuitry is configured to set the digital output to one of a first logical state or a second logical state.

20. The apparatus of claim 19, wherein the latch circuitry is first latch circuitry, the apparatus further comprising second latch circuitry coupled to the correction circuitry, the level shifter circuitry, and the first latch circuitry, the second latch circuitry is configured to latch first and second outputs of the level shifter circuitry and inputs of the first latch circuitry.

* * * * *